(12) United States Patent
Mase et al.

(10) Patent No.: US 8,264,673 B2
(45) Date of Patent: Sep. 11, 2012

(54) BACK-ILLUMINATED DISTANCE MEASURING SENSOR AND DISTANCE MEASURING DEVICE

(75) Inventors: Mitsuhito Mase, Hamamatsu (JP); Takashi Suzuki, Hamamatsu (JP); Seiichiro Mizuno, Hamamatsu (JP); Mitsutaka Takemura, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 133 days.

(21) Appl. No.: 12/666,572

(22) PCT Filed: Jul. 2, 2008

(86) PCT No.: PCT/JP2008/062005
§ 371 (c)(1),
(2), (4) Date: Jan. 19, 2010

(87) PCT Pub. No.: WO2009/005098
PCT Pub. Date: Jan. 8, 2009

(65) Prior Publication Data
US 2010/0201966 A1    Aug. 12, 2010

(30) Foreign Application Priority Data

Jul. 3, 2007 (JP) .................. 2007-175636
Jul. 3, 2007 (JP) .................. 2007-175638
Jul. 3, 2007 (JP) .................. 2007-175639

(51) Int. Cl.
*G01C 3/08* (2006.01)
*H01L 31/00* (2006.01)

(52) U.S. Cl. ........................ 356/5.01; 257/460

(58) Field of Classification Search ............. 356/5.01; 257/460
See application file for complete search history.

(56) References Cited

U.S. PATENT DOCUMENTS 7,138,646 B2 * 11/2006 Hashimoto et al. ...... 250/559.38
(Continued)

FOREIGN PATENT DOCUMENTS

CN    CN1422441    6/2003
(Continued)

OTHER PUBLICATIONS

Maruyama, Yuki, Japanese Journal of Applied Physics vol. 47, No. 1, 2008, pp. 173-178, 2008.*

*Primary Examiner* — Isam Alsomiri
*Assistant Examiner* — Antoine J Bedard
(74) *Attorney, Agent, or Firm* — Drinker Biddle & Reath LLP

(57) ABSTRACT

Two charge quantities (Q1,Q2) are output from respective pixels P (m,n) of the back-illuminated distance measuring sensor 1 as signals d'(m,n) having the distance information. Since the respective pixels P (m,n) output signals d'(m,n) responsive to the distance to an object H as micro distance measuring sensors, a distance image of the object can be obtained as an aggregate of distance information to respective points on the object H if reflection light from the object H is imaged on the pickup area 1B. If carriers generated at a deep portion in the semiconductor in response to incidence of near-infrared light for projection are led in a potential well provided in the vicinity of the carrier-generated position opposed to the light incident surface side, high-speed and accurate distance measurement is enabled.

6 Claims, 30 Drawing Sheets

U.S. PATENT DOCUMENTS

| | | | |
|---|---|---|---|
| 7,671,391 B2 * | 3/2010 | Kawahito | 257/290 |
| 7,755,743 B2 * | 7/2010 | Kumahara et al. | 356/5.05 |
| 7,923,673 B2 * | 4/2011 | Buttgen et al. | 250/208.1 |

FOREIGN PATENT DOCUMENTS

| | | |
|---|---|---|
| JP | H2-246380 | 10/1990 |
| JP | 06-053615 * | 2/1994 |
| JP | 6-53615 | 2/1994 |
| JP | H7-153986 | 6/1995 |
| JP | H9-045886 | 2/1997 |
| JP | 2003-86827 | 3/2003 |
| JP | 2003-338615 | 11/2003 |
| JP | 2005-235893 | 9/2005 |
| JP | 2006-173351 | 6/2006 |
| JP | 2008-122342 | 5/2008 |
| WO | 2007/026779 | 3/2007 |

* cited by examiner

BACK-ILLUMINATED DISTANCE MEASURING SENSOR AND DISTANCE MEASURING DEVICE

TECHNICAL FIELD

The present invention relates to a back-illuminated distance measuring sensor and a distance measuring device.

BACKGROUND ART

It has been known that a conventional active type optical distance measuring sensor irradiates light from a light source for projection such as an LED (Light Emitting Diode), etc., to an object and outputs a signal responsive to the distance to the object by detecting reflection light from the object by means of an optical detecting element. For example, a PSD (Position Sensitive Detector) has been known as an optical distance measuring sensor for optical triangulation, which is capable of easily measuring the distance to an object. However, in recent years, in order to carry out more accurate distance measurement, it is expected that an optical TOF (Time-Of-Flight) type optical distance measuring sensor will be developed.

Further, an image sensor that is capable of simultaneously acquiring distance information and image information by the same chip has been demanded for installation in a vehicle or for automatic production systems in a factory. If an image sensor is installed at the front side of a vehicle, it is expected that the image sensor will be used for detection and recognition of a preceding vehicle and pedestrians. Also, an image sensor that acquires distance information consisting of single distance information or a plurality of distance information separately from image information is expected. It is preferable that the TOF method is used for such a distance measuring sensor.

In the TOF method, pulse light is emitted from a light source for projection to an object, and the pulse light reflected from the object is detected by an optical detecting element, wherein a difference in time between emission timing and detection timing of the pulse light is measured. Since the time difference ($\Delta t$) is the time required for the pulse light to fly over the distance ($2 \times d$), which is equivalent to two times of the distance d to the object, at the light speed ($=c$), $d = (c \times \Delta t)/2$ is established. The time difference ($\Delta t$) can be said to be a phase difference between an emission pulse from the light source and a detection pulse. If the phase difference is detected, the distance d to the object can be obtained.

A light source that emits light in a near-infrared band has been frequently used as the light source for projection. Since the wavelength in the near-infrared band is similar to the visible light band than to the wavelength of the far-infrared band, it is possible to condense or image by using an optical system such as lenses. In addition, since the energy density of the near-infrared optical components included in the spectrum of sunlight is less than the visible light components, it becomes possible to detect the near-infrared optical components at a high S/N ratio by using a visible light cut filter in a state where the ratio, brought about by sunlight, of the near-infrared optical components detected by an optical detecting element is decreased.

Attention has been directed to an image sensor of a charge distribution system as an optical detecting element to carry out distance measurement by the TOF method. That is, with an image sensor of a charge distribution system, pulse-like charge that is generated in the image sensor in response to incidence of detection pulses is distributed to one potential well for an ON period of emission pulses and is distributed to another potential well for an OFF period. In this case, the ratio of the left and right distributed charges is proportionate to the phase difference between the detection pulse and the emission pulse, that is, the time required for the pulse light to fly over the distance, which is equivalent to two times the distance to an object, at light speed. Further, various types of charge distribution methods can be taken into consideration.

Also, Patent Document 1 referred to below discloses a distance measuring sensor that carriers out measurement of a distance by picking up signals based on delay time when repeated pulse light projected from a light source is reflected from an object to be measured.

Patent Document 1: Japanese Published Unexamined Patent Application No. 2005-235893

DISCLOSURE OF THE INVENTION

Problems To Be Solved By the Invention

However, where a distance to a dynamic body moving at a high speed is measured as in a distance measuring sensor for vehicular applications and military applications, it is necessary to increase the charge distribution speed so as to follow movements of the dynamic body. In addition, one frame is composed by integrating the charges by repeatedly carrying out charge distribution not by a single charge distribution in actual distance measurement. If the charge distribution speed is slow, there is a problem in which accurate distance measurement cannot be brought about without securing a sufficient S/N ratio since the number of times of a charge distribution that composes one frame is unavoidably decreased.

On the other hand, where a TOF type distance measuring sensor of a charge distribution system in which near-infrared light is made into a light source for light projection, a carrier is generated at a deep portion in a semiconductor in response to the incidence of light. For example, the thickness of silicon, which can absorb half of the light the wavelength of which is 850 nm, is approximately 20 μm. In this case, if the carrier drawing-in action to a plurality of potential wells is changed over at a high speed, a majority of the carriers cannot reach the potential wells, wherein although the charge quantity in the potential well is a factor to control the distance measurement accuracy the charge quantity cannot be secured, and a problem has been found in which highly accurate detection cannot be secured in normal distance measuring sensors of a charge distribution system. In addition, another problem arises in which, although existence of visible light is basic for the environment for measurement, visible light becomes noise for highly accurate detection by near-infrared light and it is necessary to cut the visible light. As described above, although a visible light cut filter may be provided, it is common sense in industrial applications that surplus components are omitted.

The present invention was developed in view of such problems, and it is therefore an object of the present invention to provide a back-illuminated distance measuring sensor and a distance measuring device, which are capable of detecting a distance at high accuracy.

Means For Solving the Problem

In order to solve the above-described object, the inventor, et. al., of the present application have wholeheatedly researched, and have obtained information in which, if carriers generated at a deep portion in a semiconductor in response to incidence of light for projection are drawn into a potential well provided in the vicinity of the position, at which the inverse carriers of the light incident surface are generated, accurate distance measurement is enabled at a high speed.

That is, a back-illuminated distance measuring sensor according to the present invention includes a semiconductor substrate having a light incident surface and a surface opposed to the light incident surface, a photo gate electrode provided on the surface, a first and a second gate electrodes which are provided adjacent to the photo gate electrode on the surface, and a first and a second semiconductor areas for respectively reading carriers flown from an area immediately under the photo gate electrode into areas immediately under the first and the second gate electrodes.

Also, in the above-described configuration, pulse light, which is incident from the light incident surface of the semiconductor substrate, coming from an object reaches an area immediately under the photo gate electrode provided on the surface side of the semiconductor substrate. A carrier generated in the semiconductor substrate in accordance with the incidence of the pulse light is distributed from an area immediately under the photo gate electrode to areas immediately under the first and the second gate electrodes, which are adjacent thereto. That is, if a detection gate signal synchronized with a drive signal of a light source are given to the first and the second gate electrodes alternately, the carriers generated in the area immediately under the photo gate electrode are, respectively, flown to the areas immediately under the first and the second gate electrodes, and are flown into the first and the second semiconductor areas.

The ratio of the charge quantity of carriers accumulated in the first and the second semiconductor areas to the entire charge quantity corresponds to a phase difference between emission pulse light emitted by giving a drive signal to the light source and detection pulse light returned by the emission pulse light being reflected by an object. Even if the charge distribution speed is increased by increasing the frequency of the drive signal to the gate electrode, the generation area of the carriers generated in response to incidence of the near-infrared light is nearer to the surface opposite to the light incident surface of the semiconductor substrate than to the light incident surface of the semiconductor substrate. Therefore, many carriers are flown from the area immediately under the photo gate electrode into the first and the second semiconductor areas, and the carriers may be read from these areas. In addition, since light having shorter wavelengths than that in the near-infrared light tends to be eliminated in the area at the light incident surface side of the semiconductor substrate, it is possible to improve the detection accuracy of the detection pulse light for distance measurement even if a visible light cut filter is not provided at the light incident surface side.

Also, the area immediately under the photo gate electrode is of the same conductive type as that of the semiconductor substrate, and may be composed of an electric field concentrated area having a higher impurity density than the impurity density of the semiconductor substrate.

If the impurity density immediately under the photo gate electrode is relatively increased in comparison with that of the semiconductor substrate, the electric field is concentrated to the area. The blocking layer is extended since the impurity density of the semiconductor substrate is relatively low. Therefore, although the blocking layer is extended in the longitudinal direction from the area immediately under the photo gate electrode toward the semiconductor substrate having a low density, the extending in the horizontal direction is controlled. Accordingly, since carriers absorbed by the blocking layer extended in the horizontal direction are controlled, and linkage with a blocking layer extended from the first and the second semiconductor areas can be controlled, the carriers directly flown into the first and the second semiconductor areas can be controlled, wherein crosstalk can be reduced.

Further, the conductive type of the first and the second semiconductor areas is different from the conductive type of the semiconductor substrate, and the first and the second semiconductor areas are formed in a well area, wherein the conductive type of the well area is the same conductive type as that of the semiconductor substrate, and it is preferable that the conductive type of the well area has a higher impurity density than the impurity density of the semiconductor substrate.

That is, since the conductive type of the first and the second semiconductor areas differs from the semiconductor substrate, originally, these compose a PN junction, and a blocking layer is extended from the interface to the semiconductor substrate having a low density. On the other hand, in the case of the structure described above, the first and the second semiconductor areas are formed in the well area. Since the impurity density of the well area is higher than that of the semiconductor substrate, the thickness of the blocking layer extended from the interface between the first and the second semiconductor areas and the well area is controlled, wherein a state where such a blocking layer and the original blocking layer extended from immediately under the photo gate electrode is coupled to each other can be controlled, and such a crosstalk as described above can be controlled.

In addition, the light incident surface side of the semiconductor substrate may be provided with a visible light pumping carrier re-coupled area composed of a P-type semiconductor layer and a defect layer.

In particular, where it is assumed that the absorption coefficient of visible light in a semiconductor substrate is $\alpha$, the thickness of the semiconductor substrate is t1, and the thickness of the visible light pumping carrier re-coupled area is t2, it is preferable that the following relational expressions are satisfied.

For example, if such a case is taken into consideration where the depth at which the power of light incident into the semiconductor substrate becomes 50% is regarded as a characteristic amount with the wavelength of the visible light made into 700 nm, the following is brought about.

$$-(1/\alpha) \times \ln(0.5) \mu m \leq t2$$

$$10\ \mu m \leq t1 \leq 100\ \mu m$$

In this case, it is preferable that 50% of the power is diminished in the visible light pumping carrier re-coupled area, and the light does not reach the area immediately under the photo gate electrode, and since the near-infrared light is absorbed in an area the depth of which is 10 μm or more but 100 μm or less, it is possible to collect carriers having excellent response at high sensitivity in an area immediately under the photo gate electrode.

Also, although the above-described photo gate electrode may be single per distance measuring sensor, a distance measuring sensor may be constructed so that a plurality of micro distance measuring sensors including a photo gate electrode are one-dimensionally or two-dimensionally arrayed as pixels, and a one-dimensional or two-dimensional distance image can be obtained.

That is, such a back-illuminated distance measuring sensor is a back-illuminated distance measuring sensor provided with a semiconductor substrate including a pickup area composed of a plurality of pixels, wherein respective pixels are provided with a photo gate electrode provided on the surface opposite to the light incident surface of the semiconductor substrate, a first and a second gate electrodes provided adjacent to the photo gate electrode on the surface, and a first and a second semiconductor areas for respectively reading carriers flown from the area immediately under the photo gate electrode into the area immediately under the first and the second gate electrodes.

Since the respective pixels output a signal responsive to the distance to an object as the micro distance measuring sensors described above, it is possible to obtain a distance image of an object as an aggregate of distance information to respective points on the object if reflection light from the object is imaged on the pickup areas.

A distance measuring device having the back-illuminated distance measuring sensor described above includes: the back-illuminated distance measuring sensor, a light source for emitting near-infrared light, a driving circuit for giving a pulse drive signal to the light source, a controlling circuit for giving detection gate signals synchronized with the pulse drive signal to the first and the second gate electrodes, and a calculating circuit for calculating the distance to an object based on signals read from the first and the second semiconductor areas.

As described above, the signal read from the first and the second semiconductor areas, that is, the ratio of the charge quantity of carriers accumulated in the first or the second semiconductor area to the entire charge quantity corresponds to the phase difference described above, that is, the distance to an object. The calculating circuit calculates the distance to the object in accordance with the phase difference. Where the time difference corresponding to the phase difference is $\Delta t$, the distance d is preferably given as $d=(c\times\Delta t)/2$. However, an appropriate correction calculation may be given thereto. Also, for example, where the actual distance differs from the calculated distance d, a coefficient $\beta$ to correct the latter is obtained in advance, and in a product after shipment, the result obtained by multiplying the calculated distance d by the coefficient $\beta$ may be regarded as the final calculation distance d. In addition, where the ambient temperature is measured and the light speed c differs in accordance with the ambient temperature, the distance calculation may be carried out after a calculation to correct the light speed c is executed. Further, because the relationship between the signal input in the calculating circuit and the actual distance is stored in a memory in advance, the distance may be calculated based on a look-up table system. Still further, the calculation method may be changed in accordance with the sensor structure, and the calculation method that has been publicly known may be adopted.

Also, the distance measuring device according to the present invention is featured in that the surface of the back-illuminated distance measuring sensor described above is fixed on the mount surface of a wiring substrate, the photo gate electrode, the first gate electrode and the second gate electrode are connected to wirings on the wiring substrate via bumps. The distance measuring device can be downsized since the above-described signals can be given to the respective electrodes via respective wirings if the back-illuminated distance measuring sensor is mounted on the wiring substrate.

Effects of the Invention

Highly accurate distance detection can be carried out by the back-illuminated distance measuring sensor and the distance measuring device according to the present invention.

DESCRIPTION OF REFERENCE NUMERALS

Figure 1:
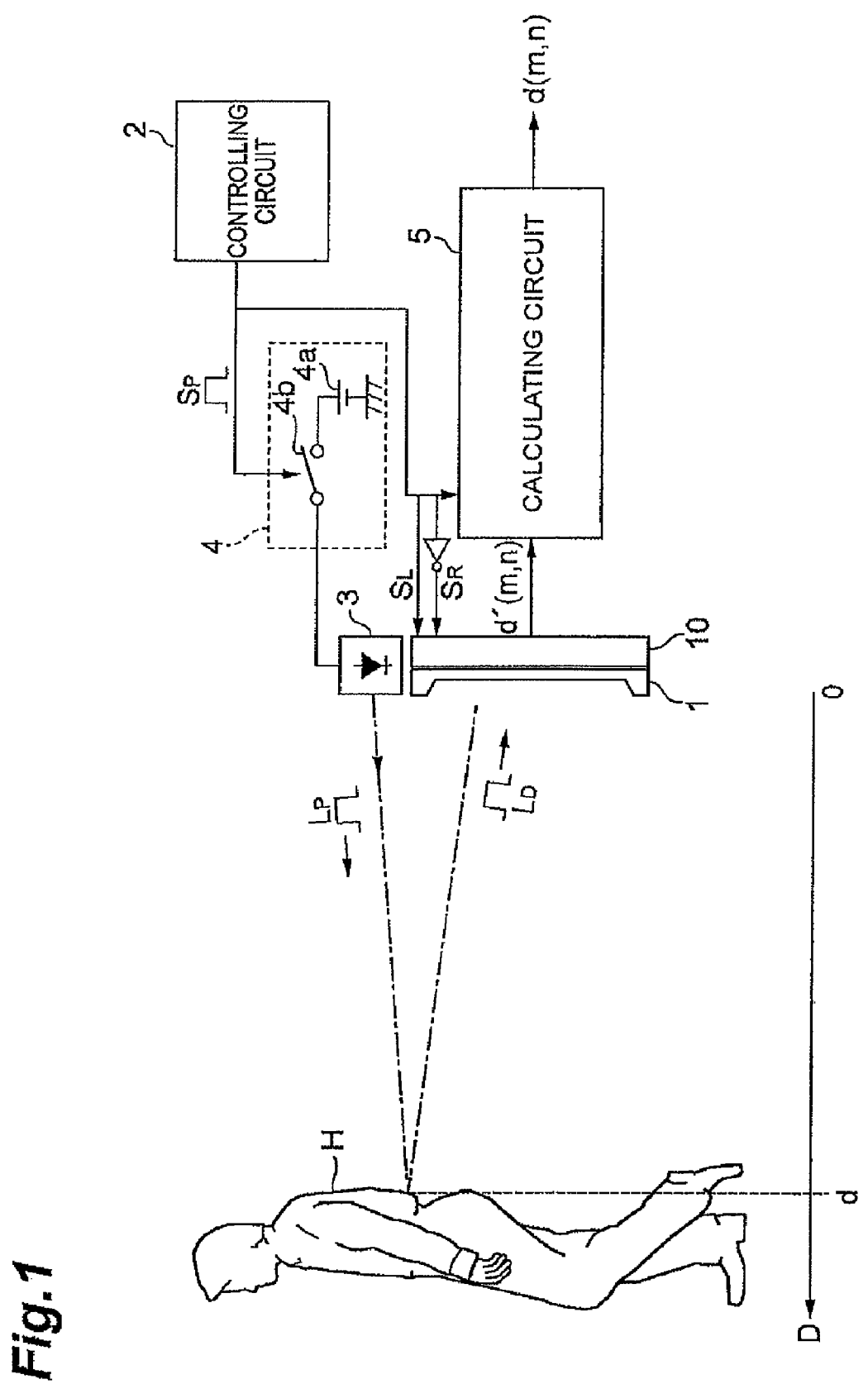
FIG. 1 is a schematic view showing a structure of a distance measuring device.

1 Back-illuminated distance measuring sensor
1A Semiconductor substrate
1B Pickup area
1D Reflection preventing film
1E Insulative layer
1BK Light incident surface
1FT Surface
2 Controlling circuit
3 Light source
4 Driving circuit
5 Calculating circuit
10 Wiring substrate
17x Penetration electrode
AD1 Adhesion layer
AD Adhesion area
AF Reinforcement area
BG Back gate semiconductor area
F Frame portion
FD1, FD2 Semiconductor area
H Object
M Mount surface
P Pixel
PG Photo gate electrode
PX1 Gate electrode
PX2 Gate electrode
SH Light absorption layer
TF Thin plate portion
W1, W2, W3 Respective well area
1G Electric field concentration area
1C Visible light pumping carrier re-coupled area

BEST MODES FOR CARRYING OUT THE INVENTION

Hereinafter, a description is given of a back-illuminated distance measuring sensor and a distance measuring device according to the embodiments. Components that are identical to each other are given the same reference numerals, and overlapping description thereof is omitted.

Embodiment 1

FIG. 1 is a schematic view showing the structure of a distance measuring sensor.

Figure 5:
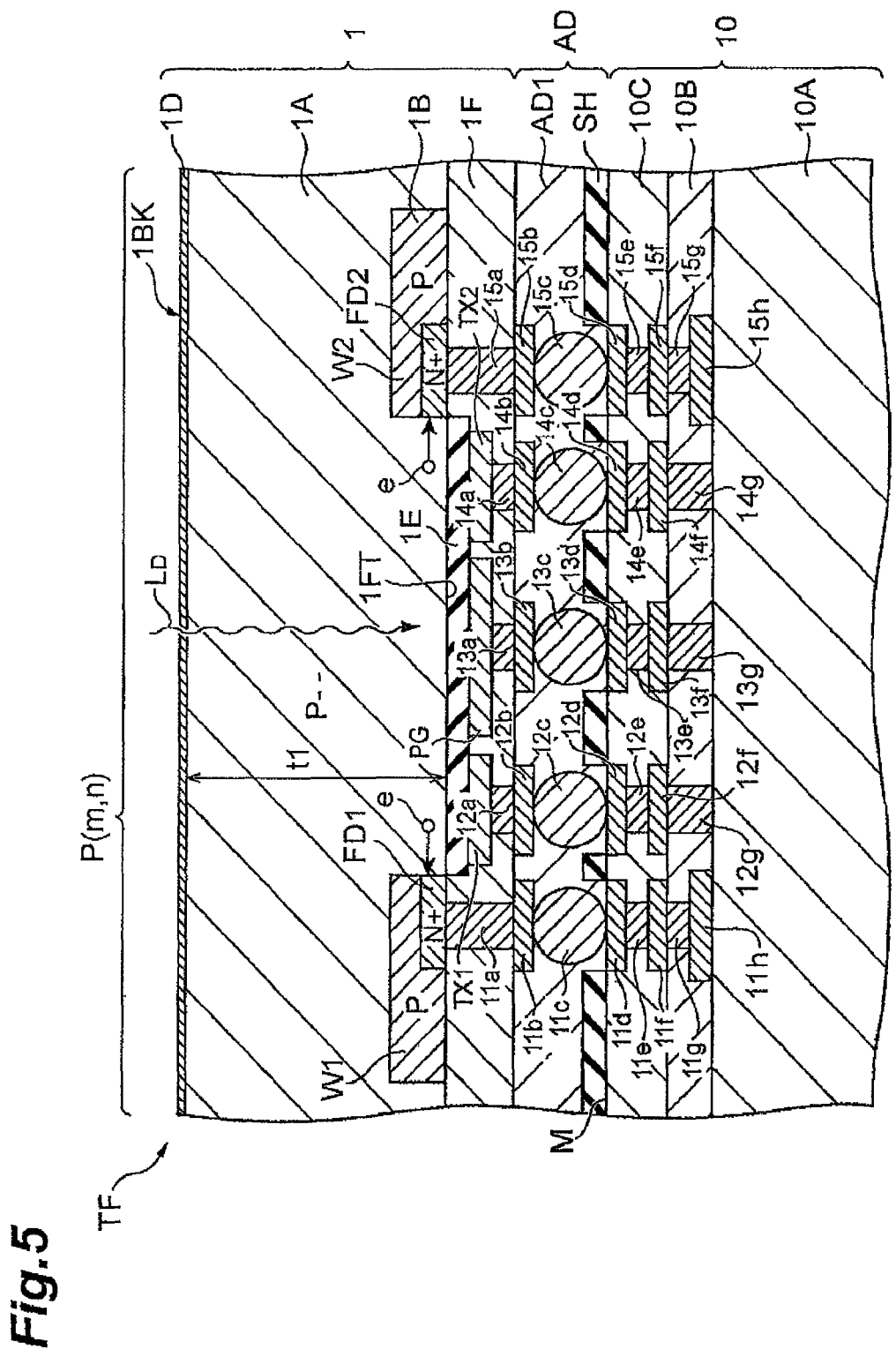
FIG. 5 is an enlarged view of an area V of the distance measuring sensor shown in FIG. 3 or FIG. 4.

The distance measuring device includes a back-illuminated distance measuring sensor 1, a light source 3 for emitting near-infrared light, a driving circuit 4 for giving a pulse drive signal $S_P$ to the light source 3, a controlling circuit 2 for giving detection gate signals $S_L$, $S_R$ synchronized with the pulse drive signal $S_P$ to the first and the second gate electrodes (TX1, TX2: Refer to FIG. 5) included in respective pixels of the back-illuminated distance measuring sensor 1, and a calculating circuit 5 for calculating the distance to an object H such as a pedestrian based on signals d' (m,n) showing distance information read from the first and the second semiconductor areas (FD1, FD2: Refer to FIG. 5) of the back-illuminated distance measuring sensor 1. The distance in the horizontal direction D from the back-illuminated distance measuring sensor 1 to the object H is regarded as d.

The controlling circuit 2 inputs the pulse drive signal $S_P$ into a switch 4b of the driving circuit 4. The light source 3 for light projection, which is composed of an LED or a laser diode is connected to the power source 4a via a switch 4b. Therefore, when the pulse drive signal $S_P$ is input into the switch 4b, a drive current having the same wavelength as that of the pulse drive signal $S_P$ is supplied to the light source 3, and pulse light $L_P$ operating as a probe light for distance measurement is output from the light source 3.

When the pulse light $L_P$ is irradiated on the object H, the pulse light is reflected by the object H, and is made incident into the back-illuminated distance measuring sensor 1 as the pulse light $L_D$. The sensor 1 generates a pulse detection signal $S_D$ as charge and outputs the same.

The back-illuminated distance measuring sensor 1 is fixed on the wiring substrate 10, and the signals d' (m,n) having distance information are output from respective pixels via wiring on the wiring substrate 10.

The waveform of the pulse drive signal $S_P$ is a rectangular waveform having cycle T. Where it is assumed that the high level is "1" and the low level is "0," the voltage V(t) is given by the following expressions.

Pulse Drive Signal $S_P$:

$V(t)=1$ (however, in the case of $0<t<(T/2)$)

$V(t)=0$ (however, in the case of $(T/2)<t<T$)

$V(t+T)=V(t)$

The waveform of the detection date signals $S_L$, and $S_R$ is a rectangular waveform having cycle T, and the voltage V(t) is given by the following expression.

Detection Gate Signal $S_L$:

$V(t)=1$ (however, in the case of $0<t<(T/2)$)

$V(t)=0$ (however, in the case of $(T/2)<t<T$)

$V(t+T)=V(t)$

Detection Gate Signal $S_R$ (=Inversion of $S_L$)

$V(t)=0$ (however, in the case of $0<t<(T/2)$)

$V(t)=1$ (however, in the case of $(T/2)<t<T$)

$V(t+T)=V(t)$

It is assumed that all of the above-described pulse signals $S_P$, $S_L$, $S_R$, and $S_D$ have a pulse cycle $2\times T_P$. It is assumed that, when both the detection gate signal $S_L$ and the pulse detection signal $S_D$ are "1," the charge quantity generated in the back-illuminated distance measuring sensor 1 is Q1, and when both the detection gate signal $S_R$ and the pulse detection signal $S_D$ are "1," the charge quantity generated in the back-illuminated distance measuring sensor 1 is Q2.

The phase difference between one detection gate signal $S_L$ and pulse detection signal $S_D$ in the back-illuminated distance measuring sensor 1 is proportionate to the charge quantity Q2 generated in the back-illuminated distance measuring sensor 1 in the overlapping period when the other detection gate signal $S_R$ and the pulse detection signal $S_D$ is "1." That is, the charge quantity Q2 is the charge quantity generated in the period in which the logic product of the detection gate signal $S_R$ and the pulse detection signal $S_D$ is "1." Where it is assumed that the entire charge quantity generated in one pixel is Q1+Q2, and the pulse width of the half cycle of the drive signal $S_P$ is $T_P$, the pulse detection signal $S_D$ is delayed only by the period of $\Delta t = T_P \times Q2/(Q1+Q2)$ with respect to the drive signal $S_P$. Since the time of flight $\Delta t$ of one pulse light is given by $\Delta t = 2d/c$ where it is assumed that the distance to an object is d, and the light speed is c, the calculating circuit 5 calculates the distance $d=(c \times \Delta t)/2 = c \times T_P \times Q2/(2 \times (Q1+Q2))$ to the object H based on the input charge quantities Q1 and Q2 and the half cycle pulse width $T_P$ defined in advance if two charge quantities (Q1,Q2) are output as signal d' having distance information from certain pixels.

As described above, if the charge quantities Q1 and Q2 are separated and read, the calculating circuit 5 can calculate the distance d. Also, the above-described pulse is repeatedly emitted, and the integration value can be output as the respective charge quantities Q1 and Q2.

In addition, the ratio of the charge quantities Q1 and Q2 to the entire charge quantity corresponds to the above-described phase difference, that is, the distance to the object H, and the calculating circuit 5 calculates the distance to the object H in accordance with the phase difference. As described above, although the distance d is given preferably by $d=(c \times \Delta t)/2$ if it is assumed that the time difference corresponding to the phase difference is $\Delta t$, an appropriate correction calculation may be given thereto. For example, where the actual distance differs from the calculated distance d, a coefficient $\beta$ is obtained in advance to correct the latter, and in a production after shipment, the final calculation distance d may be acquired by multiplying the calculated distance d by the coefficient $\beta$. In addition, where the ambient temperature is measured and the light speed c differs in accordance with the ambient temperature, the distance calculation may be carried out after a calculation to correct the light speed c is executed. Further, because the relationship between the signal input in the calculating circuit and the actual distance is stored in a memory in advance, the distance may be calculated based on a look-up table system. Still further, the calculation method may be changed in accordance with the sensor structure, and the calculation method that has been publicly known may be adopted.

Figure 2:
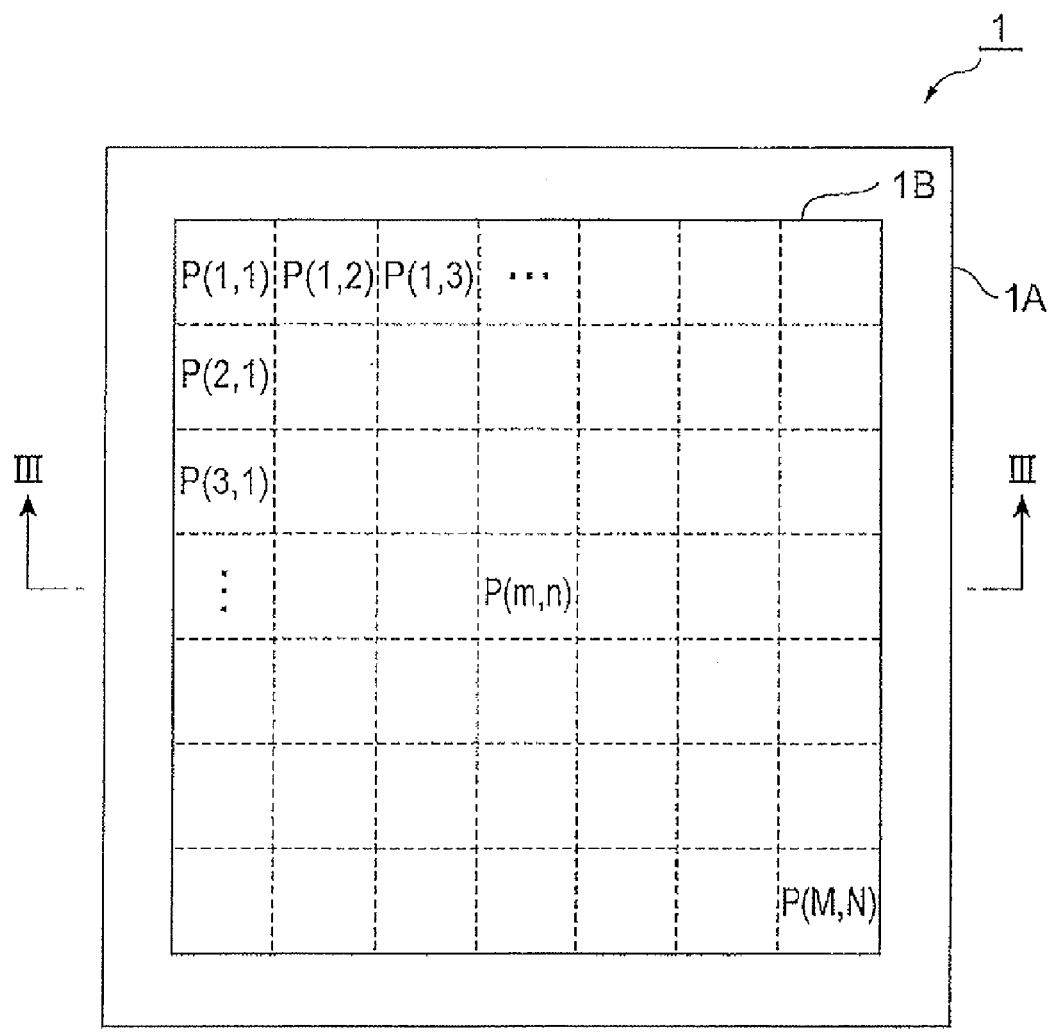
FIG. 2 is a plan view of a distance measuring sensor according to Embodiment 1.

FIG. 2 is a plan view of a distance measuring sensor according to Embodiment 1.

The back-illuminated distance measuring sensor 1 is provided with a semiconductor substrate 1A having a pickup area 1B composed of a plurality of two-dimensionally arrayed pixels P (m,n). Two charge quantities (Q1,Q2) are output from respective pixels P (m,n) as signals d'(m,n) having the above-described distance information. Since the respective pixels P (m,n) output signals d'(m,n) responsive to the distance to an object H as micro distance measuring sensors, a distance image of the object can be obtained as an aggregate of distance information to respective points on the object H if reflection light from the object H is imaged on the pickup area 1B.

Figure 3:
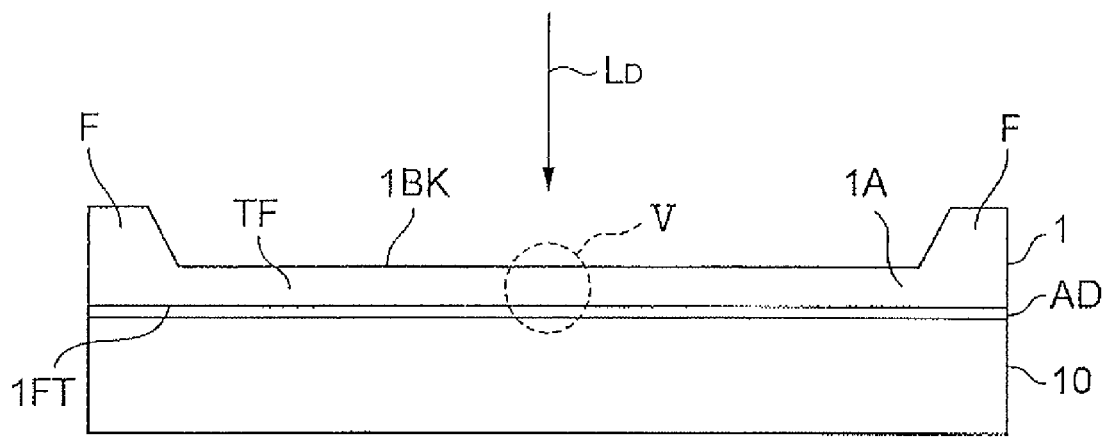
FIG. 3 is a sectional view of the distance measuring sensor shown in FIG. 2, which is taken in the direction of the arrows along the line III-III thereof.

FIG. 3 is a sectional view of the distance measuring sensor shown in FIG. 2, which is taken in the direction of the arrows along the line III-III thereof.

The pulse light $L_D$ is made incident into the back-illuminated distance measuring sensor 1 from the light incidence surface 1BK. The surface 1FT opposite to the light incidence surface 1BK of the back-illuminated distance measuring sensor 1 is connected to a wiring substrate 10 via an adhesive area AD. The adhesive area AD is an area including an adhesive element such as a bump, and has an insulative adhesive agent and filler as necessary. The semiconductor substrate 1A that composes the back-illuminated distance measuring sensor 1 has a reinforcement frame portion F and a thin plate portion TF thinner than the frame portion F, which are integrated together. The thickness of the thin plate portion TF is 10 μm or more but 100 μm or less. The thickness of the frame portion F in this example is 200 μm or more but 600 μm or less.

Figure 4:
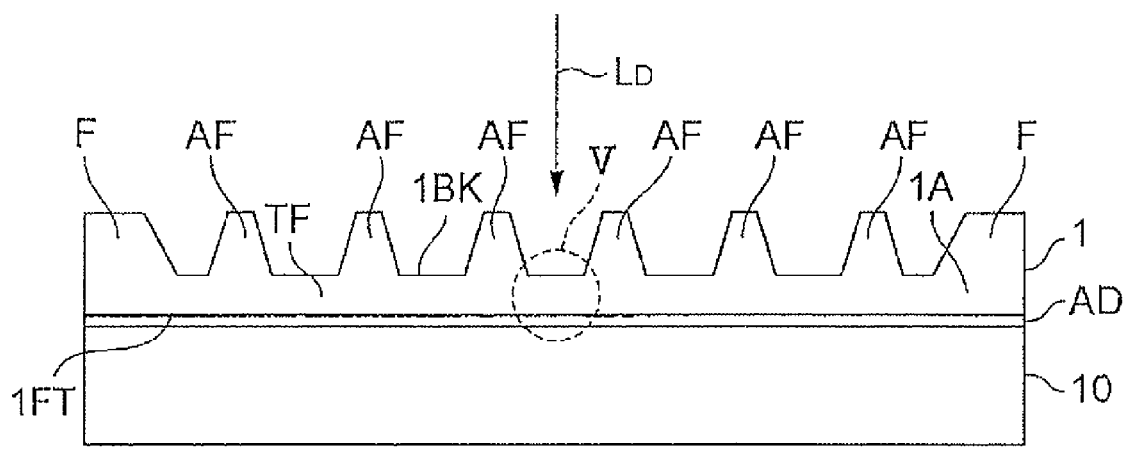
FIG. 4 is a sectional view of a distance measuring sensor according to a modified version thereof.

FIG. 4 is a sectional view of a distance measuring sensor according to a modified version of Embodiment 1.

The distance measuring sensor is different from the sensor shown in FIG. 3 only in the shape of the semiconductor substrate 1A, and other configurations remain the same. The semiconductor substrate 1A further has reinforcement portions AF formed like stripes or like a lattice, and a thin plate portion TF is formed between the reinforcement portions AF, which are integrated together. The thickness of the reinforcement portion AF according to the present version is the same as the thickness of the frame portion AF, and is 200 μm or more but 600 μm or less. The respective pixels described above are formed at the thin plate portion TF. The thin plate portion TF is formed by wet etching using an alkali etching solution such as KOH. The roughness of the exposed surface formed by etching is 1 μm or less.

FIG. 5 is an enlarged view of an area V of the distance measuring sensor shown in FIG. 3 or FIG. 4.

The back-illuminated distance measuring sensor 1 includes a semiconductor substrate 1A having a light incident surface 1BK and a surface 1FT opposed to the light incident surface 1BK, a photo gate electrode PG provided via an insulative layer 1E on the surface 1FT, a first and a second gate electrodes TX1 and TX2 provided adjacent to the photo gate electrode PG via the insulative layer 1E on the surface 1FT, and a first and a second semiconductor areas FD1 and FD2 for reading respective carriers (electronic e) flown into the area immediately under the first and the second gate electrodes TX1 and TX2. The semiconductor substrate 1A according to the present version is composed of Si, and the insulative layer 1E is formed of $SiO_2$.

The semiconductor substrate 1A is formed of a P-type semiconductor substrate of a low impurity density, and the first and the second semiconductor areas FD1 and FD2 are floating diffusion areas made of an N-type semiconductor of high impurity density. The first and the second semiconductor areas FD1 and FD2 are, respectively, formed in the P-type well areas W1 and W2. Since the vicinities of the first and the second semiconductor areas FD1 and FD2 are surrounded by the well areas W1 and W2 having higher density than the impurity density immediately under the substrate and the first and the second gate electrodes, the blocking layer is prevented from being extended from the first and the second semiconductor areas FD1 and FD2, and at the same time, a lowering in the leakage current is achieved. Further, it is possible to reduce capture of unnecessary carriers due to crosstalk and stray light. In addition, the well areas W1 and W2 prevent the blocking layer extended by application of voltage onto the photo gate electrode PG and the blocking layer extended from the first and the second semiconductor areas FD1 and FD2 from being coupled together.

Parts of the first and the second semiconductor areas FD1 and FD2 are in contact with the areas immediately under the respective gate electrodes TX1 and TX2 in the semiconductor substrate 1A. A reflection preventing film 1D is provided at the side of the light incident surface 1BK of the semiconductor substrate 1A. The surface roughness of the exposed surface of the semiconductor substrate 1A of low impurity density, that is, the difference in height between the maximum value and the minimum value for the surface unevenness is 1 µm or less. The material of the reflection preventing film 1D is $SiO_2$ or SiN.

The wiring substrate 10 is provided with a semiconductor substrate 10A formed of Si and reading wirings 11h and 15h formed on the semiconductor substrate 10A. These reading wirings 11h and 15h are, respectively, electrically connected to the first semiconductor area FD1 and the second semiconductor area FD2.

A contact electrode 11a, a pad electrode 11b, a bump 11c, a pad electrode 11d, a contact electrode 11e, an intermediate electrode 11f and a contact electrode 11g intervene between the first semiconductor area FD1 and the reading wiring 11h.

A contact electrode 15a, a pad electrode 15b, a bump 15c, a pad electrode 15d, a contact electrode 15e, an intermediate electrode 15f and a contact electrode 15g intervene between the second semiconductor area FD2 and the reading wiring 15h.

The first gate wiring 12g, a photo gate wiring 13g, and the second gate wiring 14g are provided on the semiconductor substrate 10A, which are electrically connected to the first gate electrode TX1, the photo gate electrode PG and the second gate electrode TX2, respectively.

A contact electrode 12a, a pad electrode 12b, a bump 12c, a pad electrode 12d, a contact electrode 12e, and an intermediate electrode 12f intervene between the first gate electrode TX1 and the first gate wiring 12g.

A contact electrode 13a, a pad electrode 13b, a bump 13c, a pad electrode 13d, a contact electrode 13e, and an intermediate electrode 13f intervene between the photo gate electrode PG and the photo gate wiring 13g.

A contact electrode 14a, a pad electrode 14b, a bump 14c, a pad electrode 14d, a contact electrode 14e, and an intermediate electrode 14f intervene between the second gate electrode TX2 and the second gate wiring 14g.

The respective contact electrodes are buried in a contact hole provided at the insulative layers 1F, 10B and 10C as illustrated.

The adhesive area AD is provided with an adhesive layer AD1 composed of resin, and bumps 11c, 12c, 13c, 14c and 15c to connect respective electrodes of the back-illuminated distance measuring sensor 1 to various types of wirings on the wiring substrate 10.

In the distance measuring device, the surface 1FT of the back-illuminated distance measuring sensor 1 is fixed on the mount surface M of the wiring substrate 10, the photo gate electrode PG, the first gate electrode TX1 and the second gate electrode TX2 are connected to the wiring on the wiring substrate 10 via bumps. In the distance measuring device, if the back-illuminated distance measuring sensor 1 is mounted on the wiring substrate 10, the above-described signals can be given to the respective electrodes via respective wirings, wherein the device can be downsized.

In addition, a light absorption layer SH composed of black resin is formed on the mount surface M of the wiring substrate 10, which prevents incidence of light transmitted through the back-illuminated distance measuring sensor 1 into the wiring substrate 10, and simultaneously prevents that the light reflected by the wiring on the wiring substrate 10 reversely returns to the back-illuminated distance measuring sensor 1 and results in crosstalk. Further, various types of electrodes and wirings described above are composed of aluminum or polysilicon. The thickness t1 of the semiconductor substrate made of Si in the back-illuminated distance measuring sensor 1 is 10 µm through 100 µm, preferably 15 through 50 µm. In this example, the thickness thereof is 20 µm.

In the back-illuminated distance measuring sensor 1, carriers generated at a deep portion in the semiconductor in accordance with incidence of light for projection are drawn into a potential well provided in the vicinity of the carrier generation position opposite to the light incident surface 1BK, wherein high speed and accurate distance measurement can be brought about.

Pulse light $L_D$ coining from an object, which is incident through the light incident surface (back surface) 1BK of the semiconductor substrate 1A reaches the area immediately under the photo gate electrode PG provided on the surface side of the semiconductor substrate 1A. Carriers generated in the semiconductor substrate 1A in accordance with incidence of the pulse light are distributed from the area immediately under the photo gate electrode PG to the areas immediately under the first and the second gate electrodes TX1 and TX2 adjacent thereto. That is, if the detection gate signals $S_L$ and $S_R$ synchronized with the drive signal $S_P$ of the light source are given to the first and the second gate electrode TX1 and TX2 via the wiring substrate 10 alternately, the carriers generated at the area immediately under the photo gate electrode PG are respectively flown to the area immediately under the first and the second gate electrodes TX1 and TX2, and are flown therefrom into the first and the second semiconductor areas FD1 and FD2.

The ratio of the charge quantities Q1 and Q2 of carriers accumulated in the first semiconductor area FD1 or the second semiconductor area FD2 to the entire charge quantity (Q1+Q2) corresponds to the phase difference between the emission pulse light emitted by giving the drive signal $S_P$ to the light source and the detection pulse light returned by the emission pulse light being reflected from the object H.

Since the area where carriers are generated in accordance with incidence of near-infrared light is closer to the surface 1FT opposed to the light incident surface 1BK of the semiconductor substrate 1A than the light incident surface 1BK even if the charge distribution speed is increased by increasing the frequency of drive signals (detection data signals $S_L$, $S_R$) to the gate electrodes TX1 and TX2, many carriers are flown from the area immediately under the photo gate electrode PG into the first and the second semiconductor areas FD1 and FD2, wherein the accumulated charges Q1 and Q2 can be read from these areas via the wirings 11h and 15h of the wiring substrate 10. In addition, since light having shorter wavelengths than that in the near-infrared light tends to be eliminated in the area at the light incident surface 1BK side of the semiconductor substrate 1A, it is possible to improve the detection accuracy of the detection pulse light for distance measurement even if a visible light cut filter is not provided at the light incident surface side.

Figure 6:
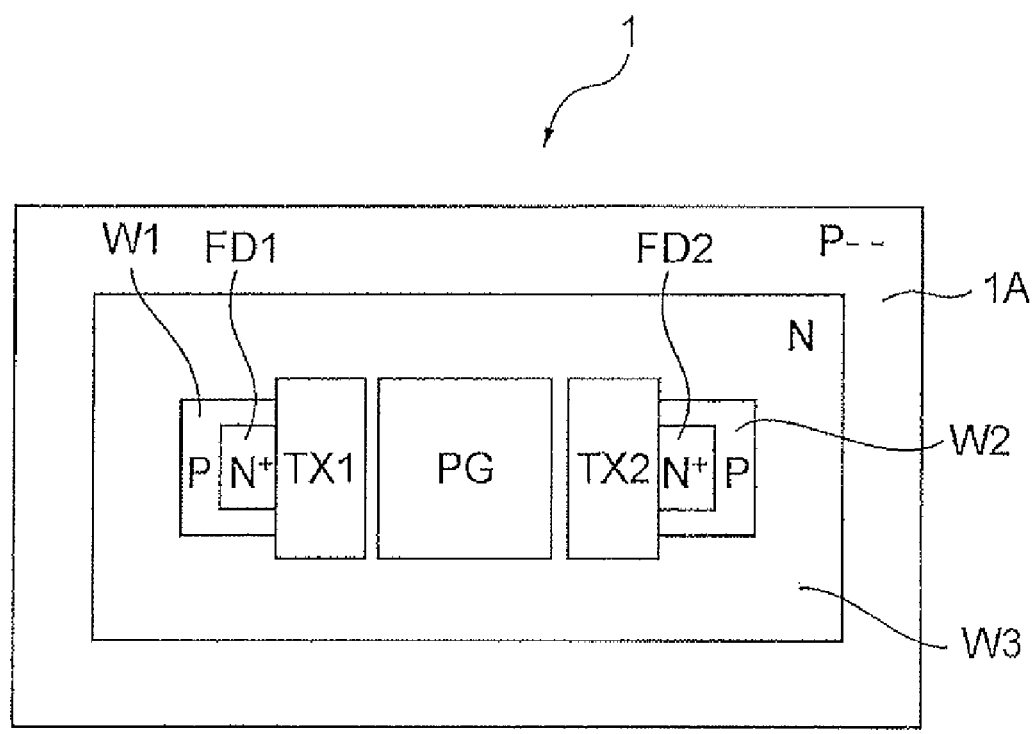
FIG. 6 is a plan view of a pixel of the distance measuring sensor according to Embodiment 1.

FIG. 6 is a plan view of a pixel of the distance measuring sensor according to Embodiment 1.

In the back-illuminated distance measuring sensor 1 described above, an N-type well area W3 may be provided outside the P-type well area W2. The well area W3 can separate pixels, and simultaneously absorb unnecessary carriers generated in accordance with stray light. In addition, the depths of the respective well areas W1, W2 and W3 are identical to each other. Further, the thickness/impurity density of the respective semiconductor areas are as follows;

Semiconductor Substrate 1A:
Thickness 10 µm through 100 µm/Impurity density $1 \times 10^{12}$ through $10^{15}$ $cm^{-3}$ Well Areas W1, W2
Thickness 0.5 µm through 3 µm/Impurity density $1 \times 10^{16}$ through $10^{18}$ $cm^{-3}$ Semiconductor Areas FD1, FD2:
Thickness 0.1 μm through 0.4 μm/Impurity density $1\times10^{18}$ through $10^{20}$ cm$^{-3}$ Well Area W3:
Thickness 0.5 μm through 3 μm/Impurity density $1\times10^{16}$ through $10^{18}$ cm$^{-3}$ In the present example, by using a high resistance substrate (in the present example, the specific resistance is 10 kΩ·cm) as the semiconductor substrate 1A, the blocking layer is radially extended from the area immediately under the photo gate electrode PG when a bias voltage is applied to the photo gate electrode PG, and the utilization efficiency of light (quantum efficiency) is increased, and the charge attempted to directly enter the first and the second semiconductor areas FD1 and FD2 is captured, thereby reducing crosstalk.

Further, in the present example, it is assumed that the thickness of the semiconductor substrate 1A is 20 μm, the impurity density is $1\times10^{12}$ cm$^{-3}$, the impurity density of the well areas W1 and W2 is $1\times10^{17}$ cm$^{-3}$, the impurity density of the semiconductor areas FD1 and FD2 is $1\times10^{19}$ cm$^{-3}$, and the impurity density of the well area W3 is $1\times10^{17}$ cm$^{-3}$.

Figure 7:
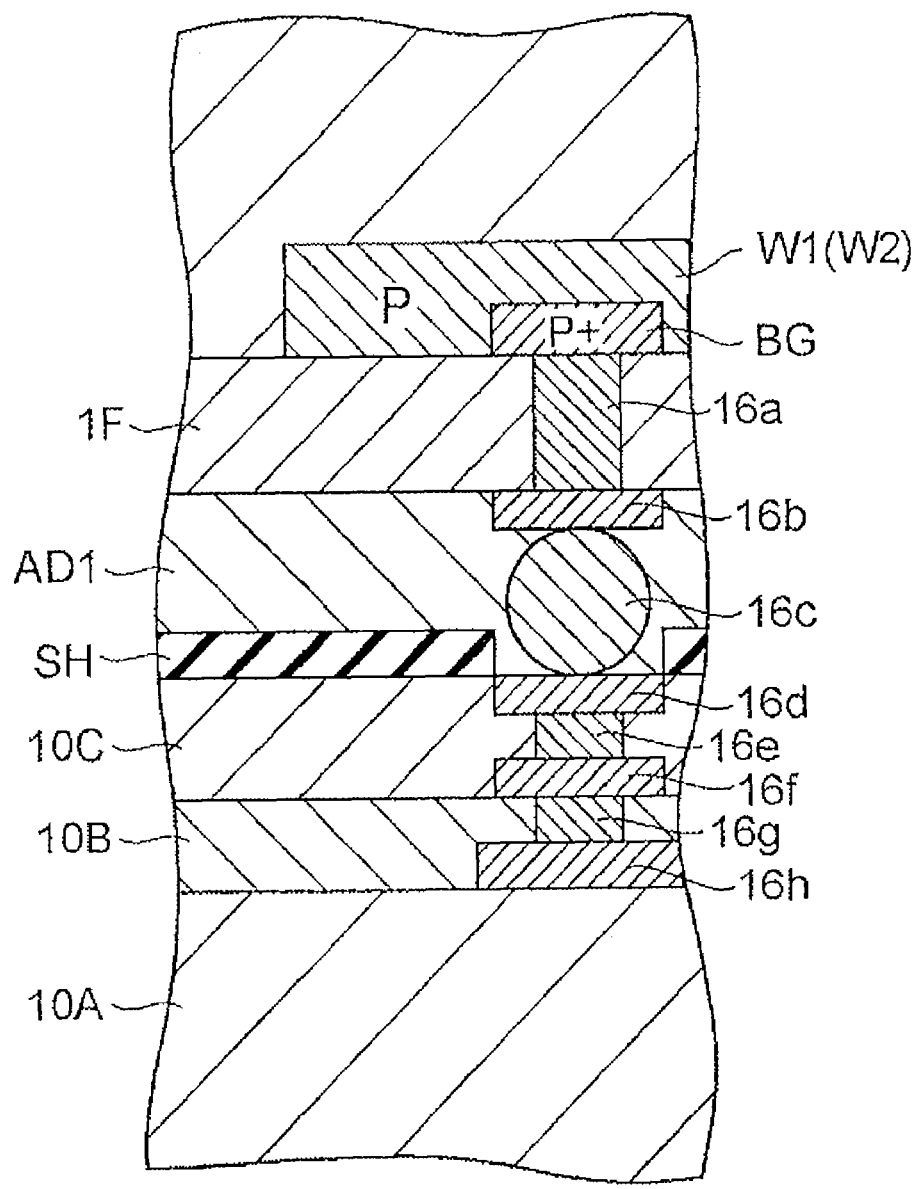
FIG. 7 is a sectional view showing the vicinity of a back gate.

FIG. 7 is a sectional view showing the vicinity of a back gate. Also, the semiconductor substrate 1A of low impurity density may be composed of an epitaxial layer.

That is, in order that the potential of the semiconductor substrate 1A of the back-illuminated distance measuring sensor 1 described above is fixed at the reference potential, the P-type well area W1 (W2) is internally provided with a P-type back gate semiconductor area BG containing a high impurity density. A ground wiring 16h is provided on the semiconductor substrate 10A of the wiring substrate 10 in which a signal reading circuit is provided. A contact electrode 16a, a pad electrode 16b, a bump 16c, a pad electrode 16d, a contact electrode 16e, an intermediate electrode 16f and a contact electrode 16g intervene between the back gate semiconductor area BG and the ground wiring 16h, which are electrically connected to each other.

Figure 8:
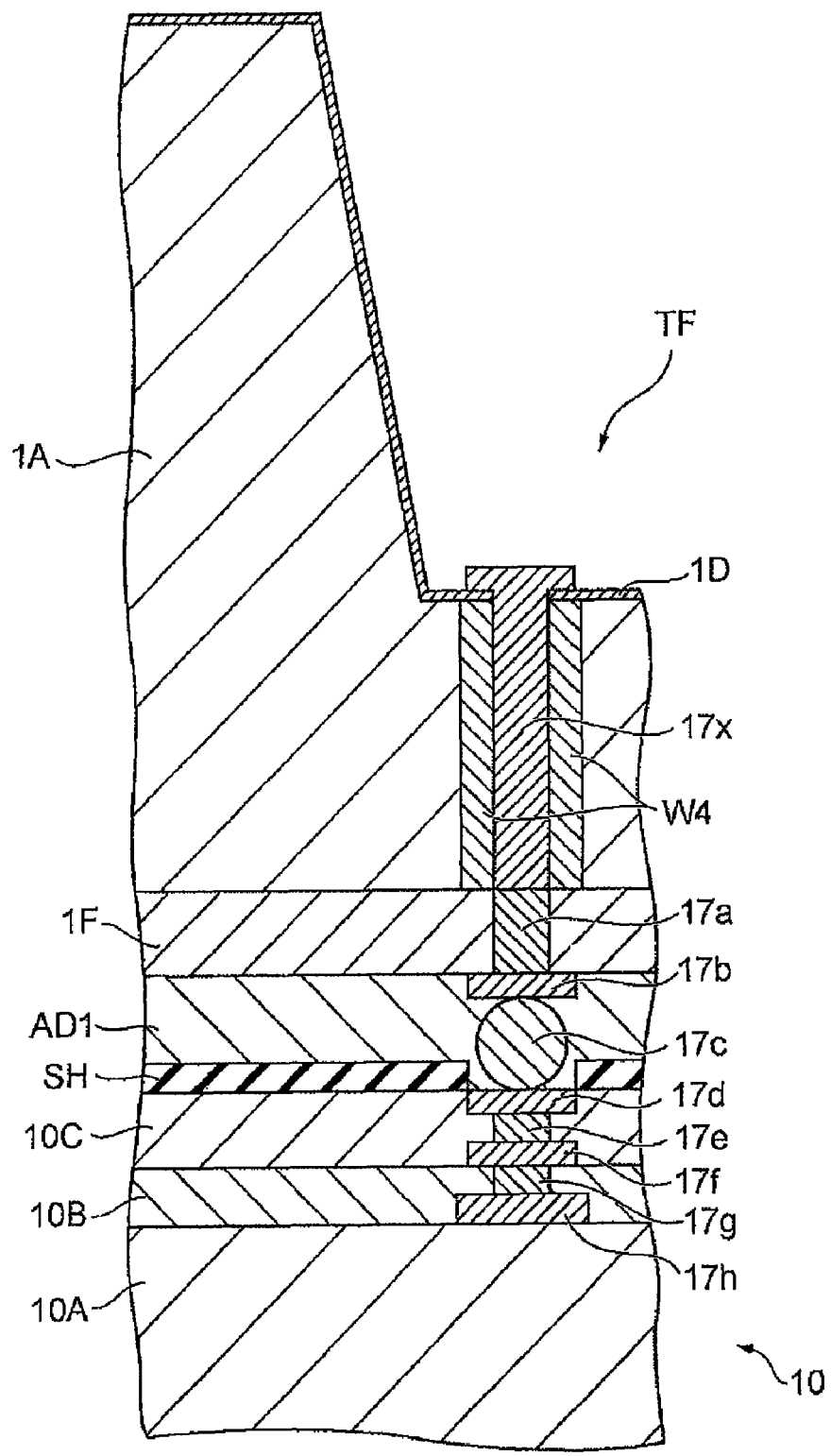
FIG. 8 is a sectional view showing the vicinity of a penetration electrode.

FIG. 8 is a sectional view showing the vicinity of a penetration electrode.

In order that the potential of the semiconductor substrate 1A of the back-illuminated distance measuring sensor 1 described above is fixed at the reference potential, the semiconductor substrate 1A is provided with a P-type semiconductor layer such as a P-type diffusion area W4 instead of the back gate electrode, and an electrically connected penetration electrode 17x may be provided. A ground wiring 17h is provided on the semiconductor substrate 10A of the wiring substrate 10. A contact electrode 17a, a pad electrode 17b, a bump 17c, a pad electrode 17d, a contact electrode 17e, an intermediate electrode 17f and a contact electrode 17g intervene between the penetration electrode 17x and the ground wiring 17h, which are electrically connected to each other.

Figure 9:
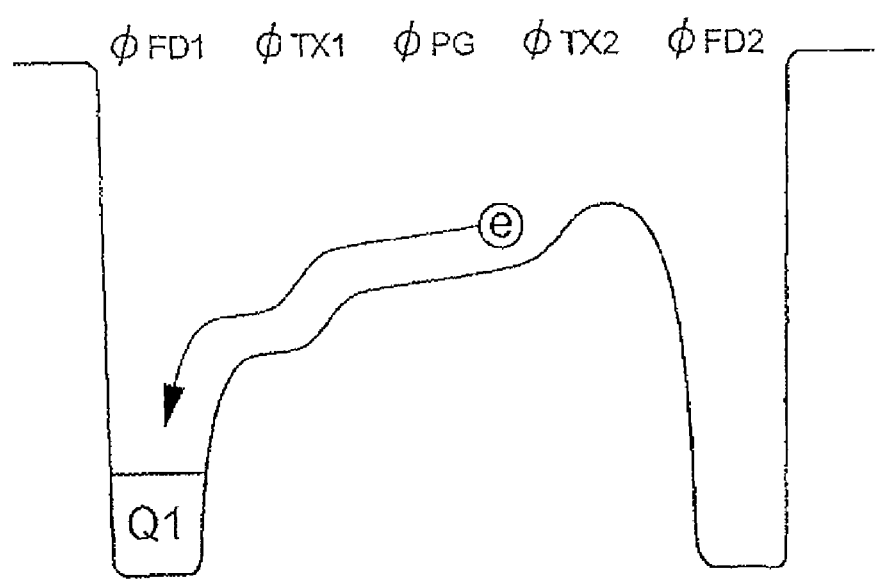
FIG. 9 is a potential view describing a carrier accumulating action.

FIG. 9 is a potential view describing a carrier accumulating action.

The potential $\phi_{PG}$ of the area immediately under the photo gate electrode PG is set to be slightly higher than the substrate potential. In the potential view, the downward direction is the positive direction of the potential. The same drawing shows the potential $\phi_{TX1}$ of the area immediately under the gate electrode TX1, the potential $\phi_{TX2}$ of the area immediately under the gate electrode TX2, the potential $\phi_{FD1}$ of the semiconductor area FD1, and the potential $\phi_{FD2}$ of the semiconductor area FD2.

If the high potential of the detection gate signal $S_L$ is input in the gate electrode TX1, the carrier (electronic e) generated immediately under the photo gate electrode PG is accumulated in the potential well of the first semiconductor area FD1 via the area immediately under the gate electrode PX1 in accordance with the potential slope, wherein the charge quantity Q1 will be accumulated in the potential well.

Figure 10:
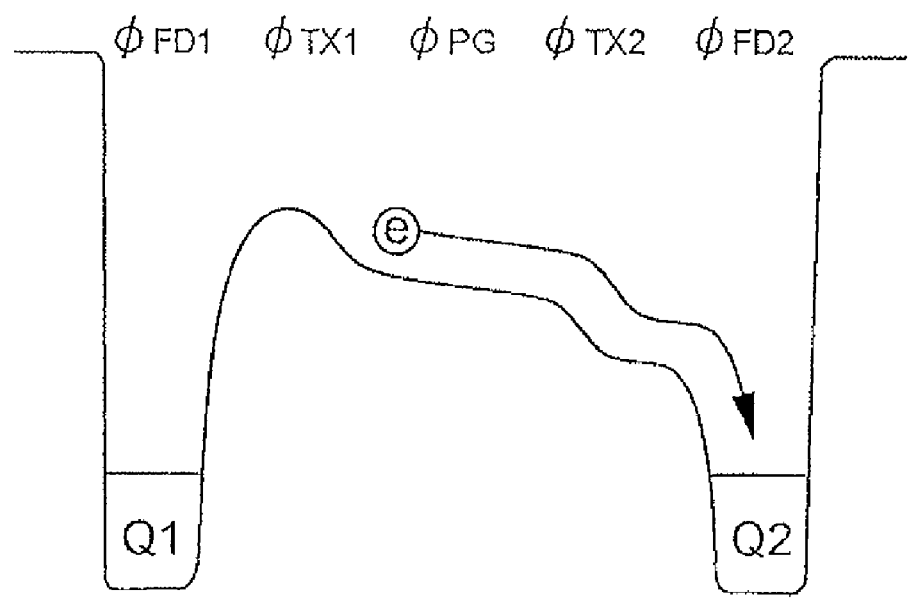
FIG. 10 is a potential view describing a carrier accumulating action.

FIG. 10 is a potential view describing a carrier accumulating action.

At the time of incidence of light, the potential $\phi_{PG}$ of the area immediately under the photo gate electrode PG is set slightly higher than the substrate potential.

If high potential of the detection gate signal $S_R$ is input into the gate electrode TX2, following the detection gate signal $S_L$, the carrier (electronic e) generated immediately under the photo gate electrode PG is accumulated in the potential well of the second semiconductor area FD2 via the area immediately under the gate electrode PX2 in accordance with the potential slope, wherein the charge quantity Q2 will be accumulated in the potential well.

As described above, the charges Q1 and Q2 accumulated in the respective potential wells are read outwardly via the reading wirings 11h and 15h (Refer to FIG. 5) provided on the wiring substrate 10.

Figure 11:
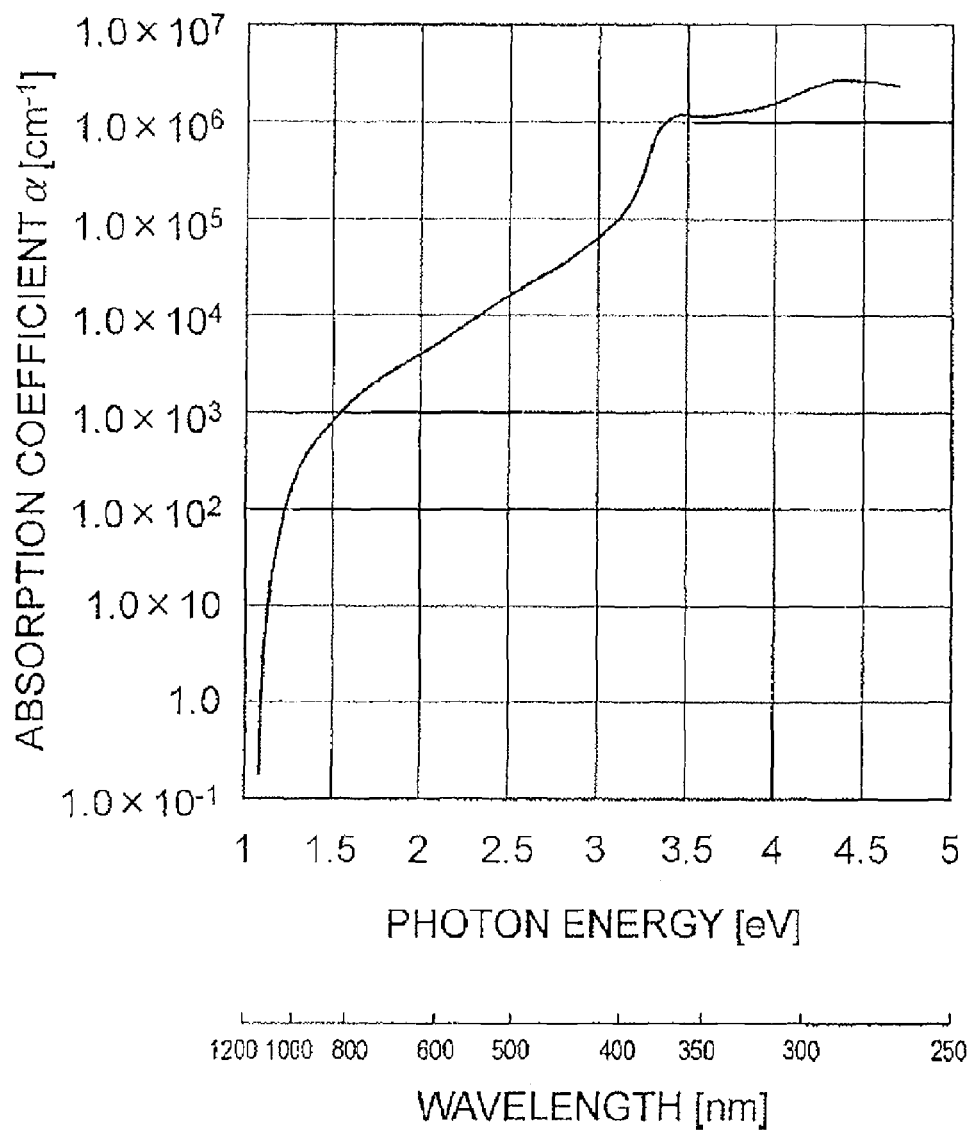
FIG. 11 is a graph showing the relationship between a wavelength (nm) of incident light and an absorption coefficient $\alpha$.

FIG. 11 is a graph showing the relationship between a wavelength (nm) of incident light and an absorption coefficient α.

Light absorption is expressed by $I=I_o \times \exp(-\alpha \times x)$ by using I (Light intensity at a specified depth), $I_o$ (Light intensity in the vicinity of the surface of semiconductor substrate), x (Depth from the surface of semiconductor substrate), and α(Absorption coefficient of light). By this expression, the depth of the Si semiconductor substrate, which absorbs half of the light whose wavelength is 700 nm becomes approximately 3 μm. The thickness t1 of the thin plate portion of the semiconductor substrate 1A according to the present mode is 10 μm through 100 μm, and light in a visible band shorter than that in the near-infrared band is absorbed, wherein highly accurate distance measurement can be brought about without providing a visible light cut filter at the light incidence surface side.

Also, since the light absorption coefficient α is $1.0\times10^3$ (cm$^{-1}$) for a wavelength of 800 nm, the light absorption coefficient α is $2.0\times10^2$ (cm$^{-1}$) for a wavelength of 900 nm, and the depth (the case of $I/I_o=1/e$) at which the incident light is absorbed by 63% is 10 μm for the wavelength of 800 nm and is 50 μm for the wavelength of 900 nm. Therefore, if the thickness of the semiconductor substrate is 10 μm through 50 μm, it is possible to sufficiently absorb light in the near-infrared band.

Figure 12:
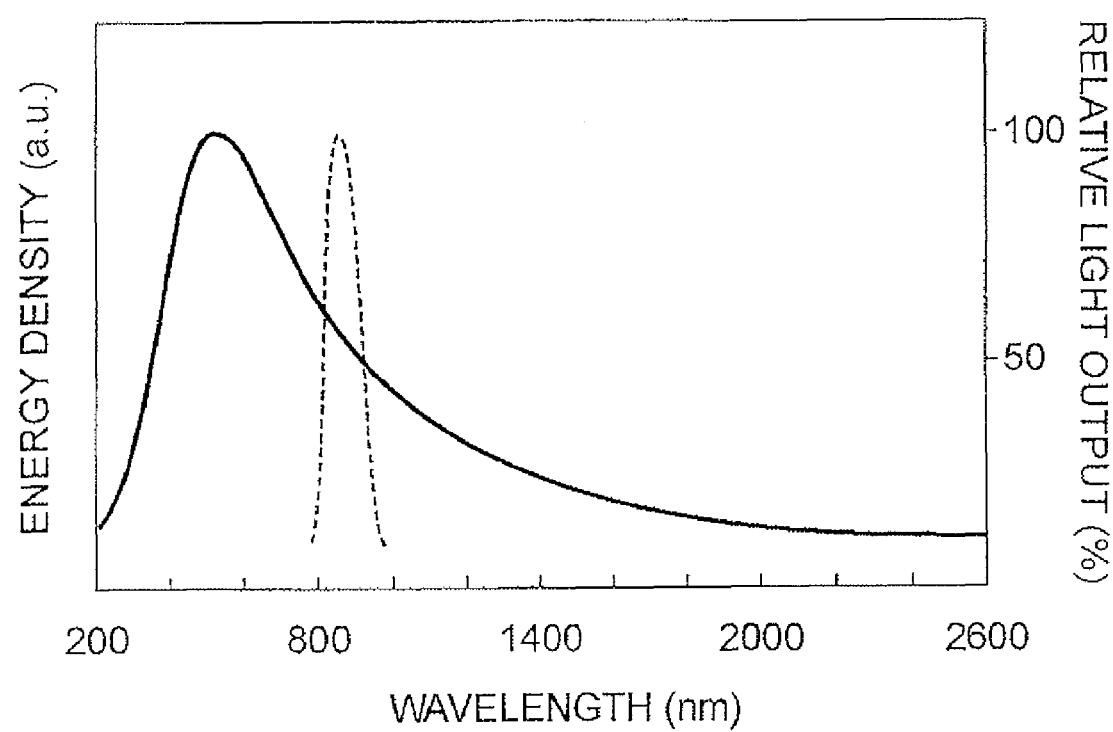
FIG. 12 is a graph showing a spectrum (solid line) of sunlight and a spectrum (dotted line) of the light source.

FIG. 12 is a graph showing a spectrum (solid line) showing the energy density of sunlight and a spectrum (dotted line) showing the relative light intensity of a near-infrared LED.

While the spectrum of sunlight has a peak in the visible band (500 nm or so), the spectrum of the near-infrared LED has a peak in, for example, 870 nm. Therefore, such a configuration is constructed in which the pulse light coming from the light source 3 is selectively separated from sunlight by eliminating the light in the visible band by means of an appropriate visible band cut filter, and carriers are generated at the side opposed to the light incident surface of a semiconductor substrate. Accordingly, carriers generated at a high near-infrared sensitivity can be collected in response to a high distribution speed, and highly accurate distance measurement can be carried out. In addition, since light in a visible band shorter than that in the near-infrared band can be absorbed on the light incident surface of the semiconductor substrate of a back-illuminated distance measuring sensor, highly accurate distance measurement can be brought about without providing a visible light cut filter at the light incident surface side.

Figure 13:
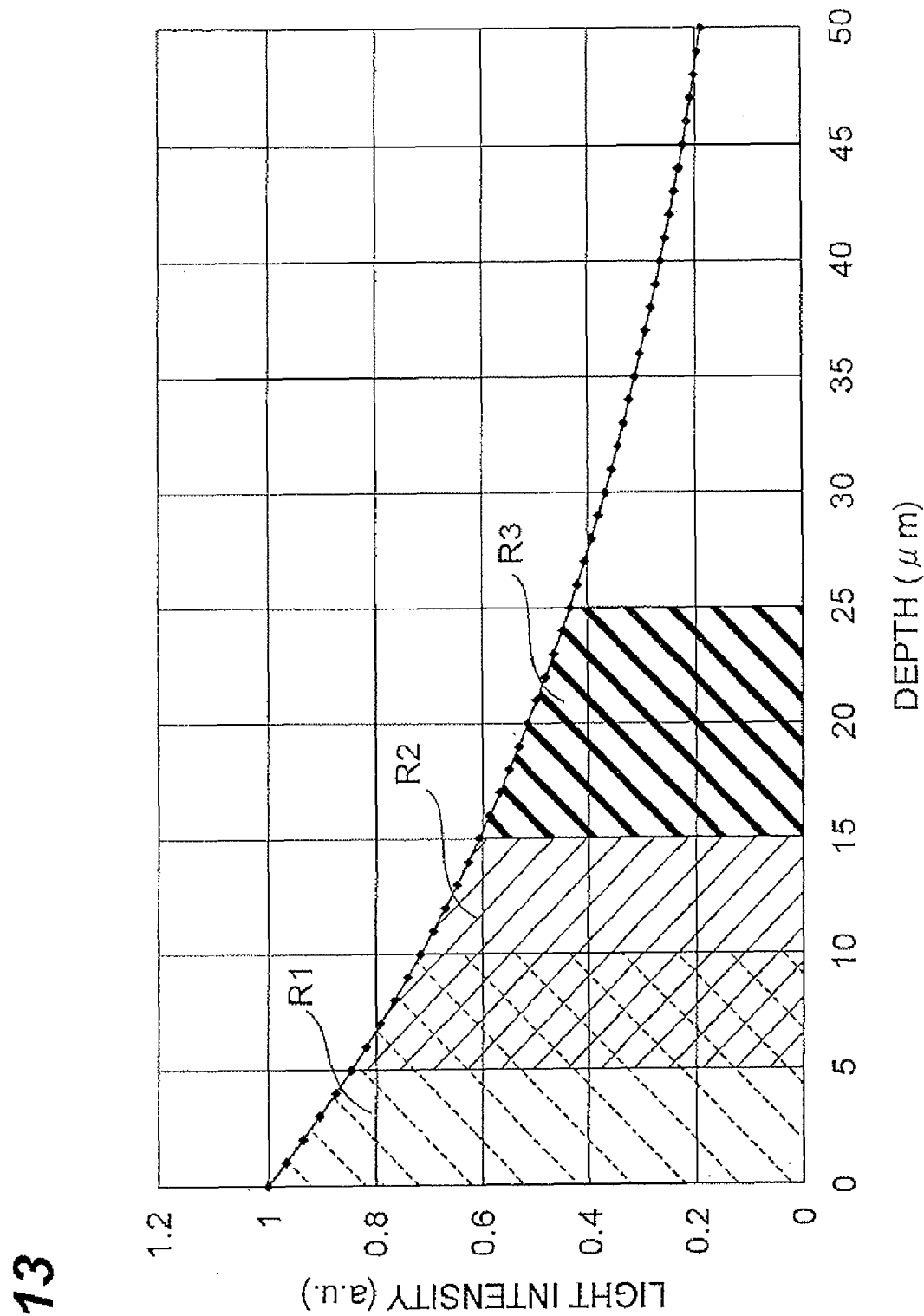
FIG. 13 is a graph showing the relationship between a depth ($\mu m$) from the light incident surface and a light intensity (a.u.)

FIG. 13 is a graph showing the relationship between a depth (μm) from the light incident surface and a light intensity (a.u.).

The thickness of the thin plate portion of a semiconductor substrate of the back-illuminated distance measuring sensor 1 is 15 μm. The light intensity (a.u.) corresponds to the number of electrons generated at the position.

Where it is assumed that, in the surface side incident type distance measuring sensor, the blocking layer is extended to the depth of 10 μm and the carriers can be captured, the dotted oblique-lined area R1 is made into carrier signal components.

On the other hand, in a case of the back-illuminated distance measuring sensor, if carriers are captured in the range of 10 μm, the solid oblique-lined area R2 is made into carrier signal components. Simply, if the numbers of carriers (sensitivity) are compared, it seems that the case of the back-illuminated distance measuring sensor is inferior to the surface side incident type distance measuring sensor in sensitivity. However, necessary signals are based on the near-infrared wavelengths, and if the blocking layer immediately under the photo gate electrode is extended to the thickness of the substrate by adjusting the substrate density and application voltage, etc., higher sensitivity than the surface side incident type distance measuring sensor can be obtained. Further, by extending the blocking layer, crosstalk for oblique incidence can be reduced.

Still further, if the gate electrodes PG, TX1 and TX2 are made of metal or polysilicon and formed with a metallic film on the light incident surface side, the light utilization efficiency can be increased because the light once transmitted through the semiconductor substrate is reflected by the metal. Since the carriers generated in the oblique-lined area R3 can be captured by utilizing reflection, the sensitivity can be improved.

In addition, a visible band cut filter may be deposited on the light incident surface side of the semiconductor substrate. Also, the distance measuring sensor described above may be assembled as a module including a light source.

Further, the relationship between the frequency of the drive signal and the measurement distance range has been taken into consideration. As a result, where it is assumed that the measurement range is a little less than 1 m up to 200 m, it has been found that it is suitable that the operation frequency of the drive signal is 0.375 MHz through 100 MHz.

Since the degree of movement of carriers is an inherent value, the degree of movement does not have any dependency on the operation frequency. Also, the distribution efficiency (transfer speed) of a charge may change by varying parameters such as voltage applied on the gate electrode, substrate density and gate oxidation film thickness. For example, if higher voltage is applied to the gate electrode, and the gate oxidation film thickness is appropriately increased with a substrate having a low density (high resistance), an effect of a fringing electric field is added to the movement of the carrier by diffusion, wherein a charge can be transferred at a high speed. By thickening the insulative layer 1E described above, the fringing electric field can be formed. The preferable thickness of the insulative layer 1E to form the fringing electric field is 50 nm through 1000 nm.

Also, the above-described photo gate electrode PG may be single per distance measuring sensor, or such a distance measuring sensor may be configured so that a plurality of micro distance measuring sensors including a photo gate electrode are one-dimensionally or two-dimensionally arrayed as pixels, and a one-dimensional or two-dimensional distance image can be obtained. In addition, it is possible that a light-shielding film having only the upward side of the photo gate electrode made open is provided on the light incident surface side of the back-illuminated distance measuring sensor 1, thereby crosstalk due to oblique incidence into the semiconductor areas FD1 and FD2 can be reduced.

Figure 14:
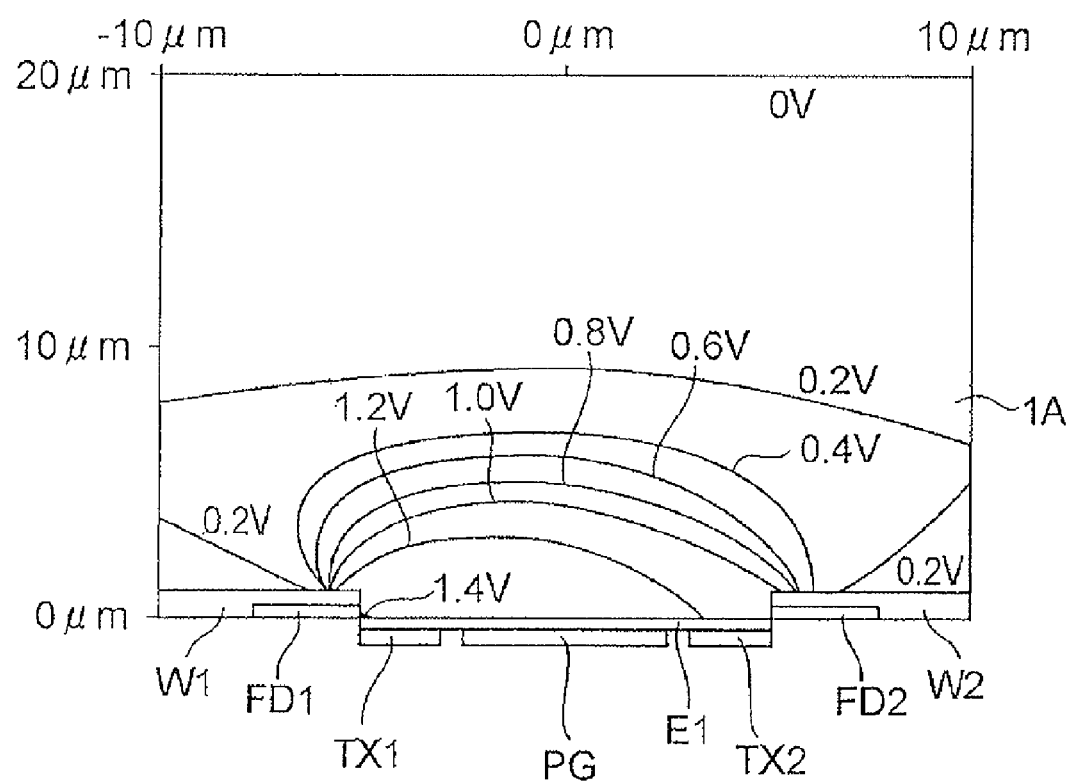
FIG. 14 is a view showing potential distribution in a semiconductor substrate.

FIG. 14 is a view showing potential distribution in a semiconductor substrate.

Voltage 2V was applied to the gate electrode TX1, 1V was applied to the photo gate electrode PG; and 0V was applied to the gate electrode TX2. The potential immediately under the gate electrodes TX1 and TX2 is increased from the area immediately under the photo gate electrode PG, wherein carriers are efficiently captured by incidence of near-infrared light into such areas, and can be transferred into the semiconductor areas FD1 and FD2 having remarkably higher potential than the peripheries. The semiconductor areas FD1 and FD2 are N-type semiconductors having a high impurity density, wherein positively ionized donors internally exist, and the potential is raised.

Embodiment 2

The structure of a distance measuring device according to Embodiment 2 is identical to that described in FIG. 1. The distance measuring device is different from the device described in FIG. 1 only in the detail of the back-illuminated distance measuring sensor 1 that composes the distance measuring device. The distance measuring device is provided with the controlling circuit 2, light source 3, driving circuit 4 and calculating circuit 5, which are described in FIG. 1.

Figure 15:
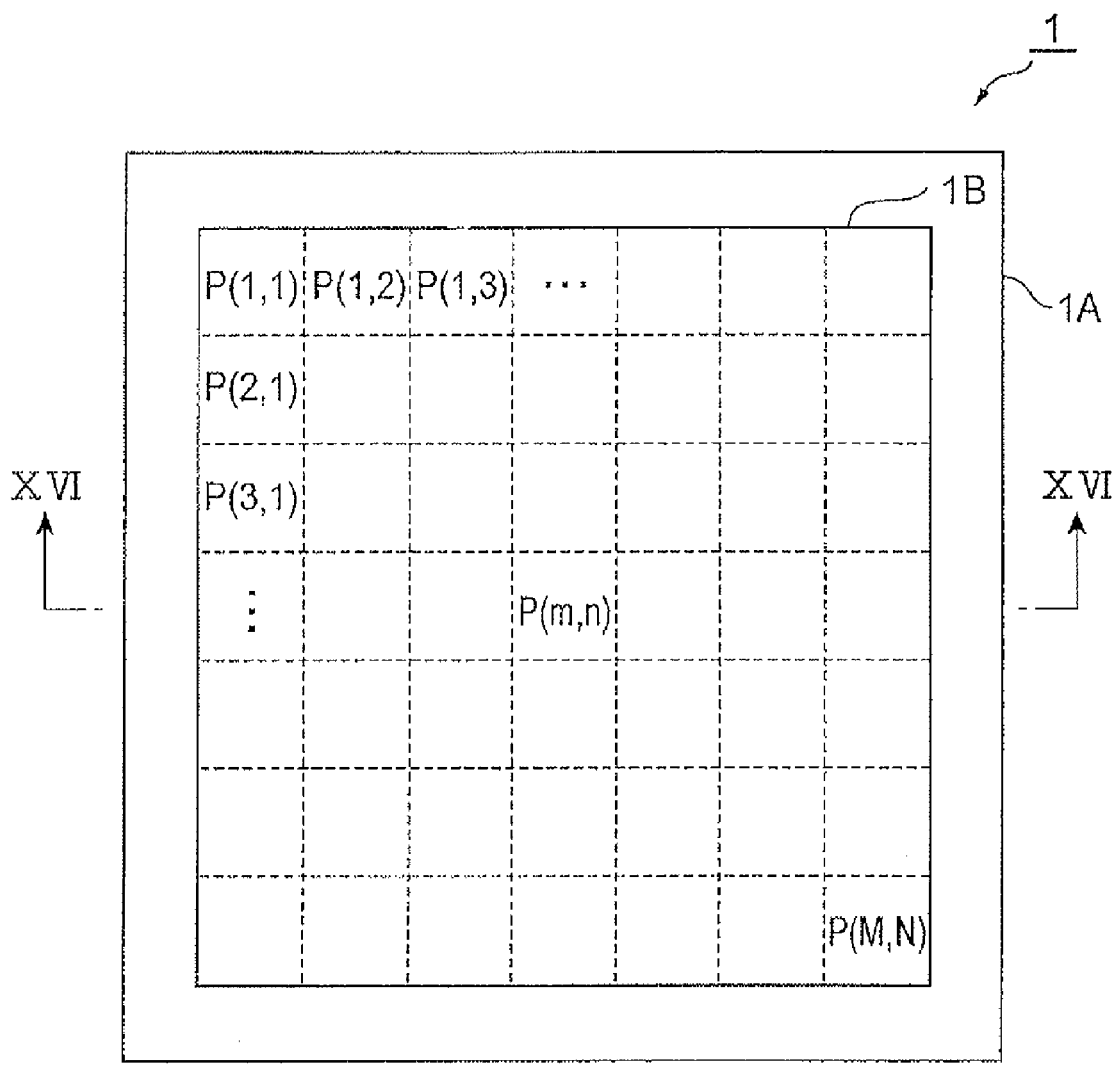
FIG. 15 is a plan view showing a distance measuring sensor according to Embodiment 2.

FIG. 15 is a plan view showing a distance measuring sensor according to Embodiment 2.

The back-illuminated distance measuring sensor 1 is provided with a semiconductor substrate 1A having a pickup area 1B composed of a plurality of two-dimensionally arrayed pixels P (m,n). Two charge quantities (Q1,Q2) are output from respective pixels P (m,n) as signals d' (m,n) having the above-described distance information. Since the respective pixels P (m,n) output signals d'(m,n) responsive to the distance to an object H as micro distance measuring sensors, a distance image of the object can be obtained as an aggregate of distance information to respective points on the object H if reflection light from the object H is imaged on the pickup area 1B.

Figure 16:
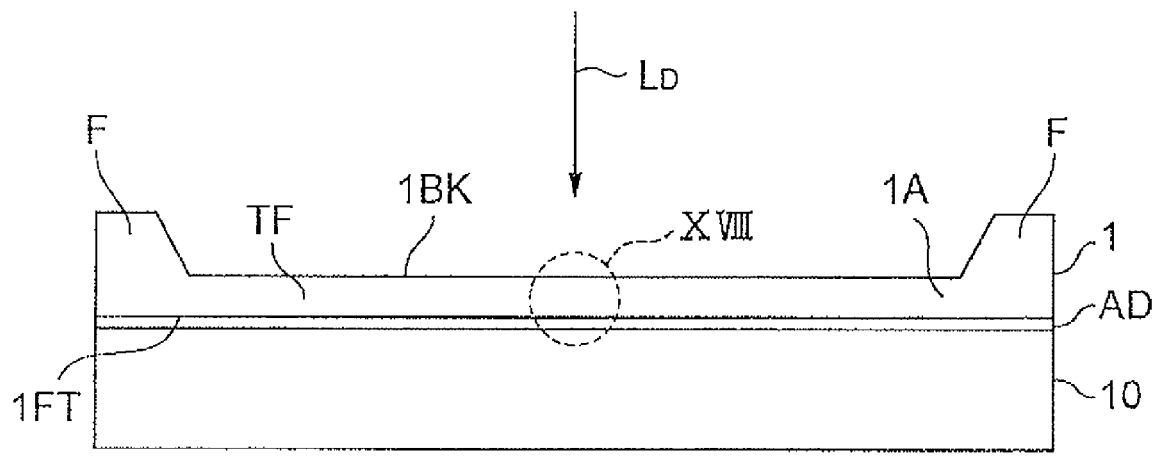
FIG. 16 is a sectional view of a distance measuring sensor shown in FIG. 15, which is taken in the direction of the arrows along the line XVI-XVI thereof.

FIG. 16 is a sectional view of a distance measuring sensor shown in FIG. 15, which is taken in the direction of the arrows along the line XVI-XVI thereof.

Pulse light $L_D$ is made incident from the light incident surface 1BK into the back-illuminated distance measuring sensor 1. The surface 1FT opposite to the light incident surface 1BK of the back-illuminated distance measuring sensor 1 is connected to a wiring substrate 10 via an adhesive area AD. The adhesive area AD is an area including adhesive elements such as bumps, and has an insulative adhesive agent or filler as necessary. The semiconductor substrate 1A that composes the back-illuminated distance measuring sensor 1 has a reinforcement frame portion F and a thin plate portion TF which is thinner than the frame portion F, which are integrated together. The thickness of the thin plate portion TF is 10 μm or more but 100 μm or less. The thickness of the frame portion F in this example is 200 μm or more but 600 μm or less.

Figure 17:
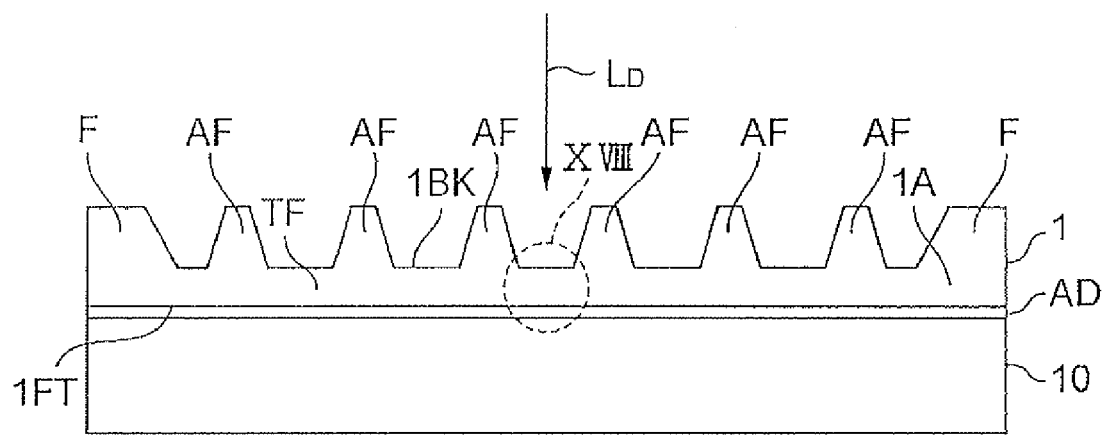
FIG. 17 is a sectional view showing a distance measuring sensor according to a modified version thereof.

FIG. 17 is a sectional view of a distance measuring sensor according to a modified version of Embodiment 2.

The distance measuring sensor is different from the sensor shown in FIG. 16 only in the shape of the semiconductor substrate 1A, and other configurations remain the same. The semiconductor substrate 1A further has reinforcement portions AF formed like stripes or like a lattice, and a thin plate portion TF is formed between the reinforcement portions AF, which are integrated together. The thickness of the reinforcement portion AF according to the present version is the same as the thickness of the frame portion AF, and is 200 µm or more but 600 µm or less. The respective pixels described above are formed at the thin plate portion TF. The thin plate portion TF is formed by wet etching using an alkali etching solution such as KOH. The roughness of the exposed surface formed by etching is 1 µm or less.

Figure 18:
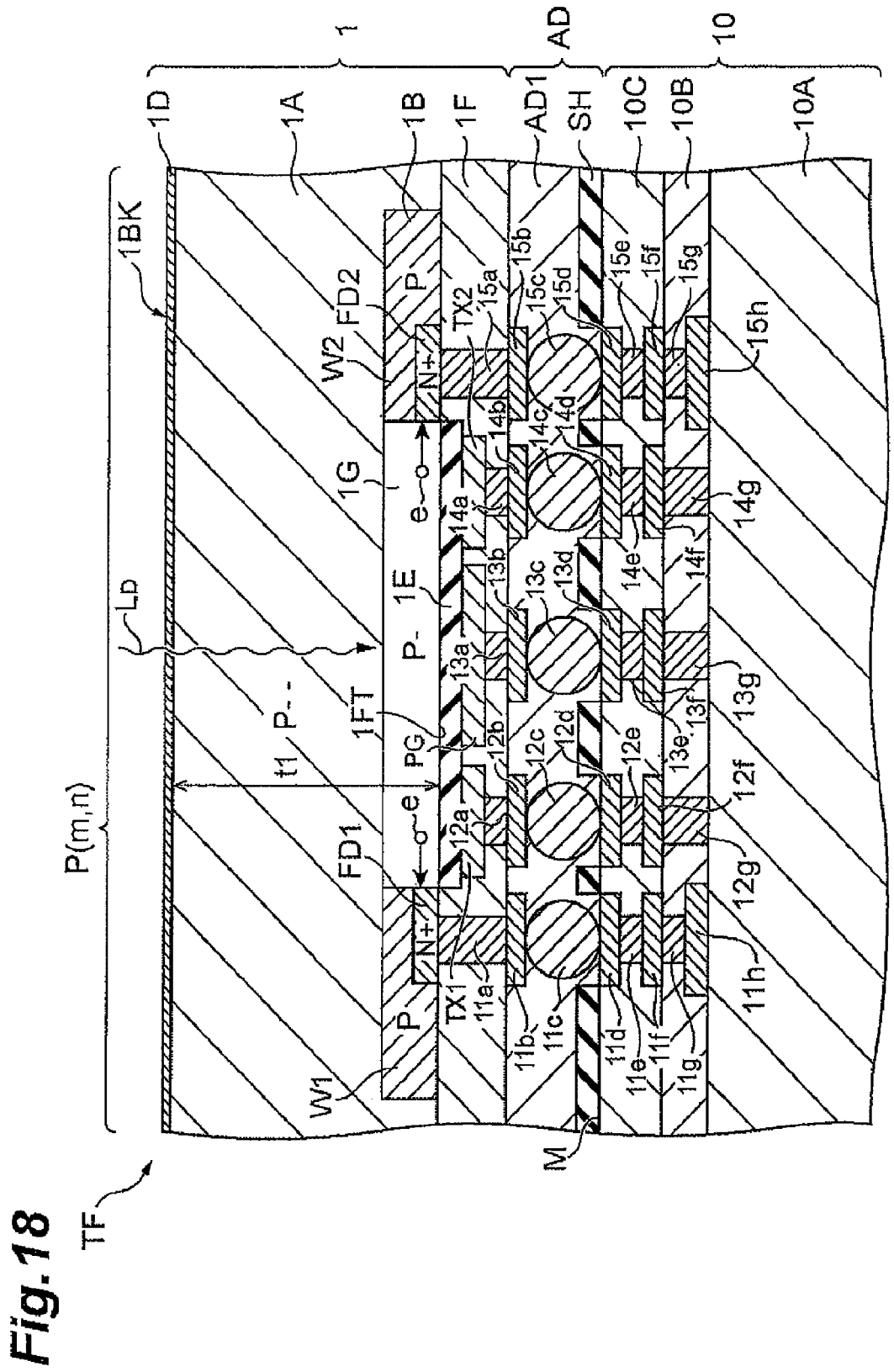
FIG. 18 is an enlarged view of an area XVIII of the distance measuring sensor shown in FIG. 16 or FIG. 17.

FIG. 18 is an enlarged view of an area XVIII of the distance measuring sensor shown in FIG. 16 or FIG. 17.

Since the basic structure of the back-illuminated distance measuring sensor 1 is the same as that according to Embodiment 1, which is shown in FIG. 5, a description is given only of differing points.

That is, in the back-illuminated distance measuring sensor 1, the area immediately under the photo gate electrode PG is a P-type that is the same conductive type as the semiconductor substrate 1A. The area is composed of an electric field concentrated area 1G having a higher impurity density than the impurity density of the semiconductor substrate 1A. Since the electric field concentrated area 1G has a relatively higher impurity density than the semiconductor substrate 1A, the ionized impurity density becomes higher when being blocked, wherein the slope of the potential, that is, the electric field can be raised, and the electric field is concentrated in this area. Since the impurity density of the semiconductor substrate 1A is relatively low, the blocking layer is extended in the semiconductor substrate 1A.

Therefore, although the blocking layer is extended in the longitudinal direction from the electric field concentrated area 1G immediately under the photo gate electrode PG toward the semiconductor substrate 1A of low impurity density, extending thereof in the lateral direction is controlled. Although described later in detail, in the structure, the blocking layer is prevented from being extended in the lateral direction in the semiconductor substrate 1A immediately under the electric field concentrated area 1G; and the carriers accumulated as signals are prevented. Further, linkage thereof with the blocking layer extended from the first and the second semiconductor areas FD1 and FD2 are prevented. Therefore, since carriers that are flown directly into the first and the second semiconductor areas FD1 and FD2 are prevented, crosstalk can be reduced.

The electric field concentrated area 1G is formed by diffusing or pouring the epitaxial layer or impurities in a silicon substrate. If the thickness of the electric field concentrated area 1G is made thin to be 0.2 µm through 3 µm, preferably, 1 µm through 3 µm, an electric field is operated on the semiconductor substrate 1A having a low impurity density, and a blocking layer is extended in the semiconductor substrate 1A.

The conductive type of the first and the second semiconductor areas FD1 and FD2 differs from the conductive type of the semiconductor substrate 1A. The first and the second semiconductor areas FD1 and FD2 are formed in the well areas W1 and W2. The conductive type of the well areas W1 and W2 is the same conductive type as that of the semiconductor substrate 1A, and has a higher impurity density than the impurity density of the electric field concentrated area 1G.

Since the conductive type of the first and the second semiconductor areas FD1 and FD2 differs from that of the semiconductor substrate 1A, originally, these components compose a PN junction, and a blocking layer is extended from the boundary to the semiconductor substrate of low density. On the other hand, in the case of the present embodiment, the first and the second semiconductor areas FD1 and FD2 are formed in the well areas W1 and W2, and the impurity density of the well areas W1 and W2 is sufficiently higher than that of the semiconductor substrate 1A. Therefore, the thickness of the blocking layer extended from the boundary between the first and the second semiconductor areas FD1 and FD1 and the well areas W1 and W2 is controlled, wherein such a state can be prevented from occurring that the blocking layer is coupled with the original blocking layer extended from immediately under the photo gate electrode PG, and the crosstalk can be prevented from occurring as described above.

In the back-illuminated distance measuring sensor 1, the carriers generated at a deep portion in the semiconductor in response to the incidence of light for projection are drawn into a potential well provided in the vicinity of the carrier-generated position at the opposite side of the light incident surface 1BK, wherein high-speed and accurate distance measurement is enabled. In addition, the distance measuring device according to Embodiment 2 and the distance measuring actions of the back-illuminated distance measuring sensor 1 thereof are identical to those of Embodiment 1.

Figure 19:
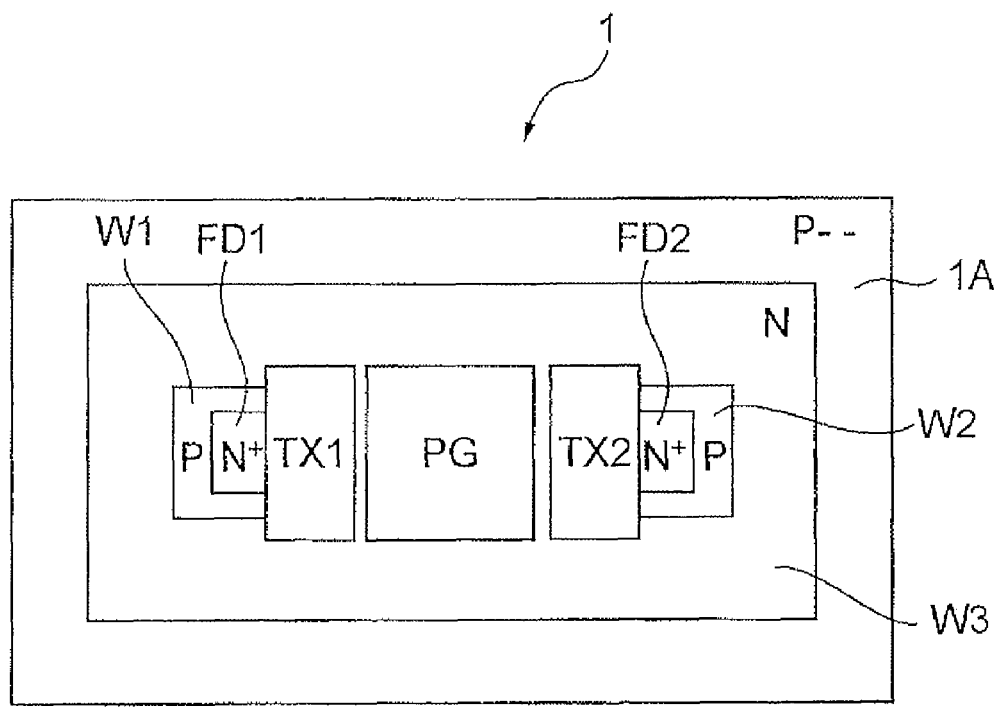
FIG. 19 is a plan view of a pixel of the distance measuring sensor according to Embodiment 2.

FIG. 19 is a plan view of a pixel of the distance measuring sensor according to Embodiment 2.

In the above-described back-illuminated distance measuring sensor 1, an N-type well area W3 may be provided outside the P-type well area W2. The well area W3 can separate pixels and can absorb unnecessary carriers generated in accordance with stray light. Also, the depths of the respective well areas W1, W2, and W3 are the same. Further, the thickness/impurity density of the respective semiconductor areas are as follows;

Semiconductor Substrate 1A:
Thickness 10 µm through 100 µm/Impurity density $1 \times 10^{12}$ through $10^{15}$ cm$^{-3}$ Well Areas W1 and W2
Thickness 0.5 µm through 3 µm/Impurity density $1 \times 10^{16}$ through $10^{18}$ cm$^{-3}$ Semiconductor Area FD1 and FD2:
Thickness 0.1 µm through 0.4 µm/Impurity density $1 \times 10^{18}$ through $10^{20}$ cm$^{-3}$ Well Area W3:
Thickness 0.5 µm through 3 µm/Impurity density $1 \times 10^{16}$ through $10^{18}$ cm$^{-3}$ Electric Field Concentrated Area 1G (FIG. 18)
Thickness 0.2 µm through 3 µm/Impurity density $1 \times 10^{13}$ through $10^{16}$ cm$^{-3}$ In the present example, by using a high resistance substrate (in the present example, the specific resistance: 10 KΩ·cm) as the semiconductor substrate 1A, the blocking layer is radially extended from the area immediately under the photo gate electrode PG when applying bias voltage to the photo gate electrode PG, and the utilization efficiency of light (quantum efficiency) is increased. Further, the crosstalk can be reduced by capturing charges that are attempted to directly enter the first and the second semiconductor areas FD1 and FD2.

In addition, it is assumed that the thickness of the semiconductor substrate 1A of the present example is 20 µm, the impurity density is $1 \times 10^{12}$ cm$^{-3}$, the impurity density of the well areas W1 and W2 is $1 \times 10^{17}$ cm$^{-3}$, the impurity density of the semiconductor areas FD1 and FD2 is $1 \times 10^{19}$ cm$^{-3}$, the impurity density of the well area W3 is $1 \times 10^{17}$ cm$^{-3}$, and the impurity density of the electric field concentrated area 1G is $1 \times 10^{15}$ cm$^{-3}$.

Also, the structure in the vicinity of the back gate and the structure in the vicinity of the penetration electrode are the same as those described in FIG. 7 and FIG. 8 of Embodiment 1.

Figure 20:
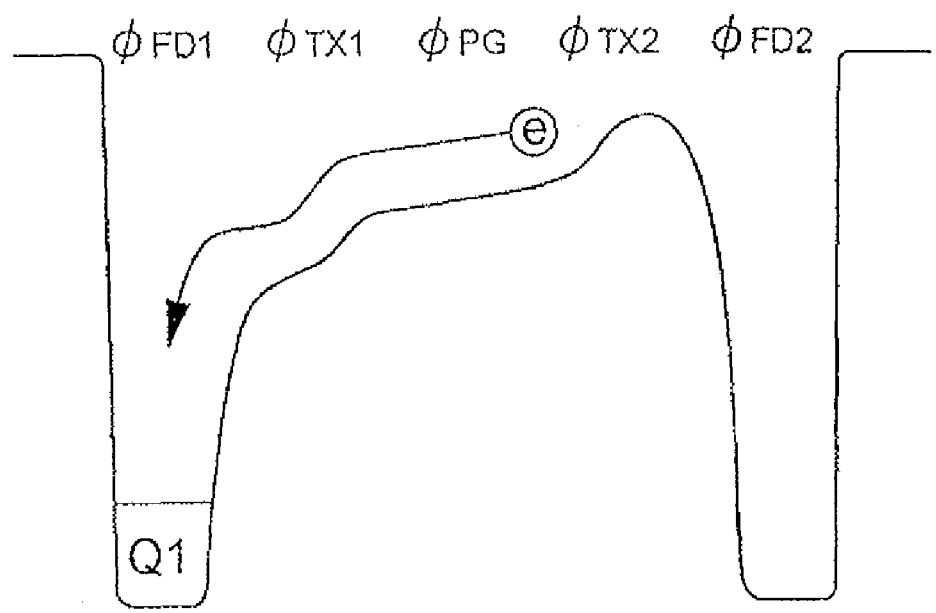
FIG. 20 is a potential view describing a carrier accumulating action.

FIG. 20 is a potential view describing a carrier accumulating action.

When light is incident, the potential $\phi_{PG}$ which is the area immediately under the photo gate electrode PG is set to be slightly higher than the potential of the substrate. In the potential view, the downward direction is the positive direction of potential, and the same drawing shows the potential $\phi_{TX1}$ of the area immediately under the gate electrode TX1, the potential $\phi_{TX2}$ of the area immediately under the gate electrode TX2, the potential $\phi_{FD1}$ of the semiconductor area FD1, and the potential $\phi_{FD2}$ of the semiconductor area FD2, respectively.

When high potential of the detection date signal $S_L$ is input into the gate electrode TX1, the carriers (electronic e) generated immediately under the photo gate electrode PG are accumulated in the potential well of the first semiconductor area FD1 via the area immediately under the gate electrode PX1 in accordance with the potential slope, and the charge quantity Q1 will be accumulated in the potential well.

Figure 21:
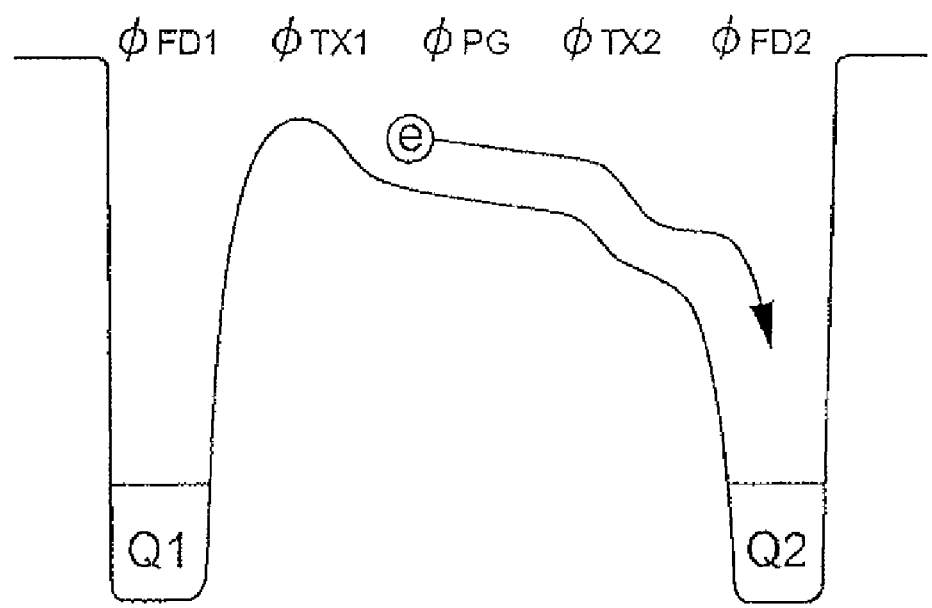
FIG. 21 is a potential view describing a carrier accumulating action.

FIG. 21 is a potential view describing a carrier accumulating action.

When light is incident, the potential $\phi_{PG}$ of the area immediately under the photo gate PG is set to be slightly higher than the substrate potential.

If the high potential of the detection gate signal $S_R$ is input into the gate electrode TX2, following the detection gate signal $S_L$, the carriers (electronic e) generated immediately under the photo gate electrode PG are accumulated in the potential well of the second semiconductor area FD2 via the area immediately under the gate electrode PX2 in accordance with the potential slope, and the charge Q2 will be accumulated in the potential well.

As described above, the charges Q1 and Q2 accumulated in the respective potential wells are read outside via reading wirings 11h and 15h (refer to FIG. 18) provided on the wiring substrate 10.

Further, in the present example, if the thickness of the semiconductor substrate is 10 µm through 50 µm, light in the near-infrared band can be sufficiently absorbed. Also, since the present embodiment is constructed so that, by eliminating light in the visible band by means of an appropriate visible band cut filter, pulse light from the light source 3 can be selectively separated from sunlight, and further, carriers are generated at the opposite side of the light incident surface of the semiconductor substrate, carriers generated at a high near-infrared sensitivity can be collected in response to a high distribution speed, wherein highly accurate distance measurement can be carried out. In addition, since light in a visible band shorter than that in the near-infrared band can be absorbed in the light incident surface of the semiconductor substrate of the back-illuminated distance measuring sensor, highly accurate distance measurement can be brought about without providing a visible light cut filter at the light incident surface side. Also, in the present embodiment, necessary signals are of a near-infrared wavelength, and if the blocking layer immediately under the photo gate electrode is extended to the thickness of the substrate by adjusting the substrate density, application voltage, etc., higher sensitivity than the surface incident type distance measuring sensor can be obtained. Further, if the blocking layer is extended, crosstalk can be reduced with respect to oblique incidence.

Still further, since light that has once transmitted through the semiconductor substrate is reflected by metal if the gate electrodes PG, TX1 and TX2 are made of metal or polysilicon and have the light incident surface side formed with a metallic film, the utilization efficiency of light can be raised. Using reflection, the carriers generated in the inclined area R3 can be captured, wherein the sensitivity can be improved.

In addition, a visible band cut filter may be deposited on the light incident surface side of the semiconductor substrate. Also, the above-described distance measuring sensor may be made into a module, including the light source.

Also, the relationship between the frequency of the drive signal and the measurement distance range has been taken into consideration. As a result, where the measurement range is a little less than 1 m up to 200 m, it has been found that the operation frequency of the drive signal is 0.375 MHz through 100 MHz. If the operation frequency is set to 0.01 MHz (50000 ps), 0.1 MHz (5000 ps), 0.375 MHz (1333 ps), 1 MHz (500 ps), 10 MHz (50 ps), 100 MHz (5 ps), or 1000 MHz (0.5 ps), the measurement distance range is, respectively, 7500 m, 750 m, 200 m, 75 m, 7.5 m, 0.75 m, and 0.075 m. Also, the values in the parentheses are half of the operation rate and show the pulse width.

Further, since the degree of movement of carriers is an inherent value, the degree of movement is not dependent on the operation frequency. Still further, the distribution efficiency (transfer speed) of a charge changes by varying parameters such as voltage applied onto the gate electrode, substrate density and gate oxidation film thickness, etc. For example, if high voltage is applied to the gate electrode, and the gate oxidation film thickness is made appropriately thick with a substrate of low density (high resistance), an effect of a fringing electric field is added in addition to movements of the carriers by diffusion, wherein the charge can be transferred at a high speed. If the above-described insulative layer 1E is thickened, a fringing electric field can be formed. The preferable thickness of an insulative layer 1E to form the fringing electric field is 50 nm through 100 nm.

Also, the above-described photo gate electrode PG may be single per distance measuring sensor or such a distance measuring sensor may be configured so that a plurality of micro distance measuring sensors including a photo gate electrode may be one-dimensionally or two-dimensionally arrayed as pixels, and a one-dimensional or two-dimensional distance image can be obtained. In addition, it is possible that a light-shielding film having only the upward side of the photo gate electrode made open is provided on the light incident surface side of the back-illuminated distance measuring sensor 1, wherein crosstalk due to oblique incidence into the semiconductor areas FD1 and FD2 can be reduced.

A simulation was carried out with respect to potential distribution in the distance measuring sensor described above. The distance measuring sensor according to Embodiment 2 is provided with an electric field concentrated area 1G as shown in FIG. 18. The distance measuring sensor according to Embodiment 1 is not provided therewith.

Figure 22:
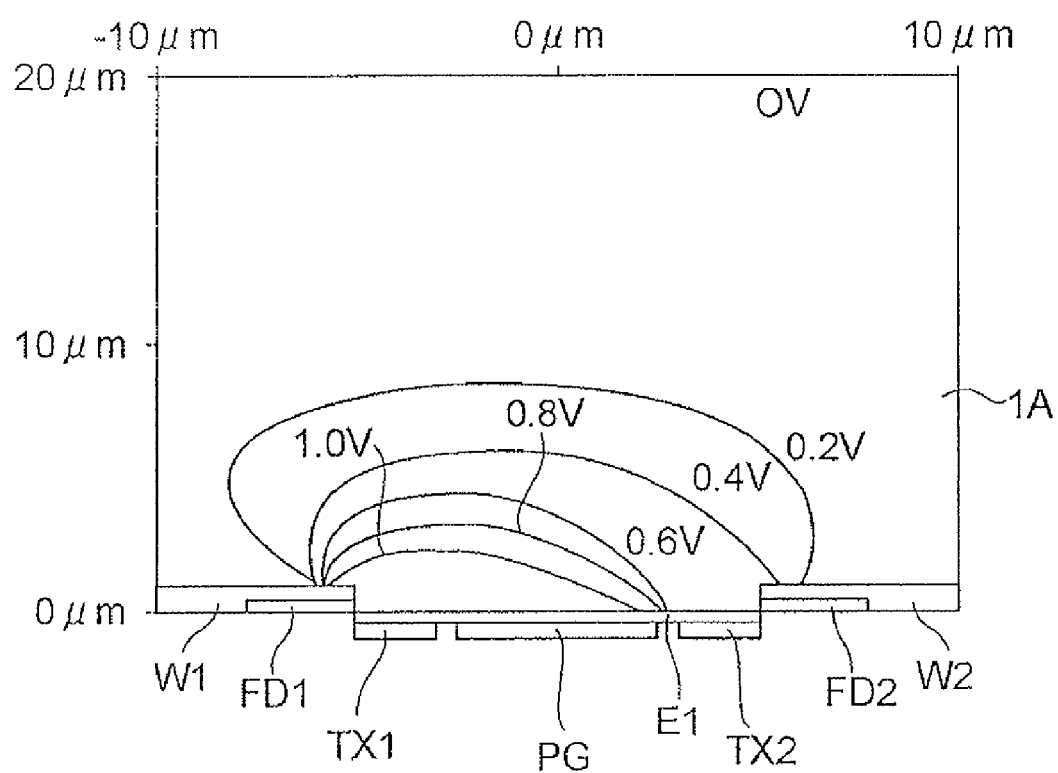
FIG. 22 is a view showing potential distribution in a semiconductor substrate according to Embodiment 2.
Figure 23:
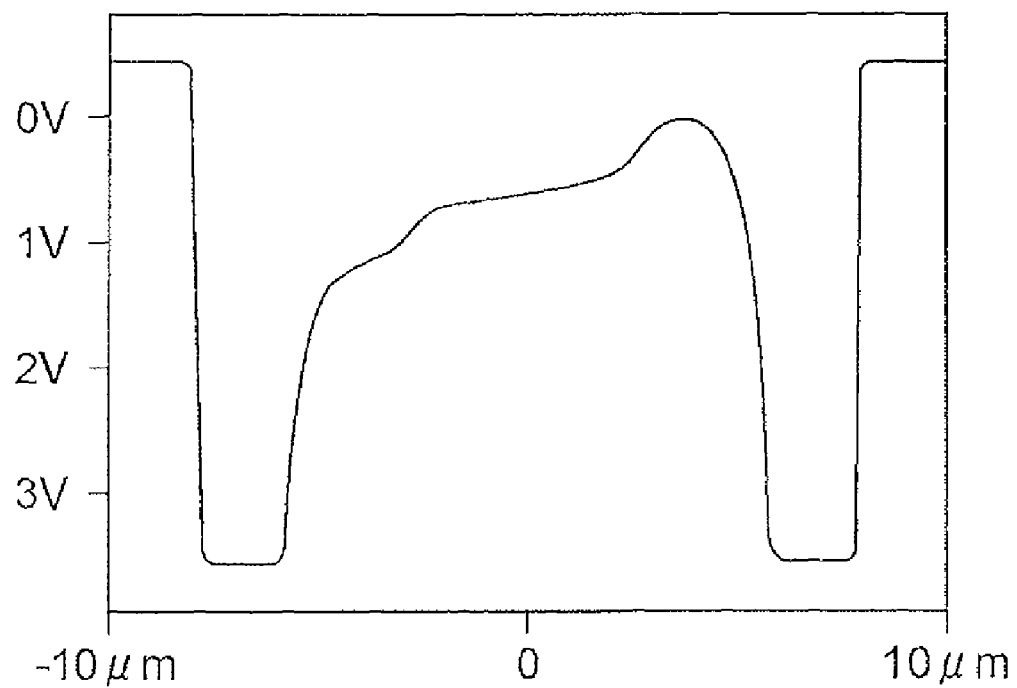
FIG. 23 is a graph showing potentials immediately under the photo gate electrode PG, two gate electrodes TX1, TX2, and semiconductor areas FD1, FD2 according to Embodiment 2.

FIG. 22 is a view showing potential distribution in a semiconductor substrate according to Embodiment 2. FIG. 23 shows potentials immediately under the photo gate electrode PG, two gate electrodes TX1, TX2, and semiconductor areas FD1, FD2 according to Embodiment 2. The abscissa of FIG. 23 is coincident with the abscissa of FIG. 22.

Voltage 2V was applied to the gate electrode TX1, 1V was applied to the photo gate electrode PG, and 0V was applied to the gate electrode TX2. The potential immediately under the gate electrodes TX1 and TX2 is increased from the area immediately under the photo gate electrode PG, wherein carriers are efficiently captured by incidence of near-infrared light into such areas, and can be transferred into the semiconductor areas FD1 and FD2 having remarkably high potential than the peripheries. The semiconductor areas FD1 and FD2 are N-type semiconductors having a high impurity density, wherein positively ionized donors internally exist, and the potential is raised.

Figure 24:
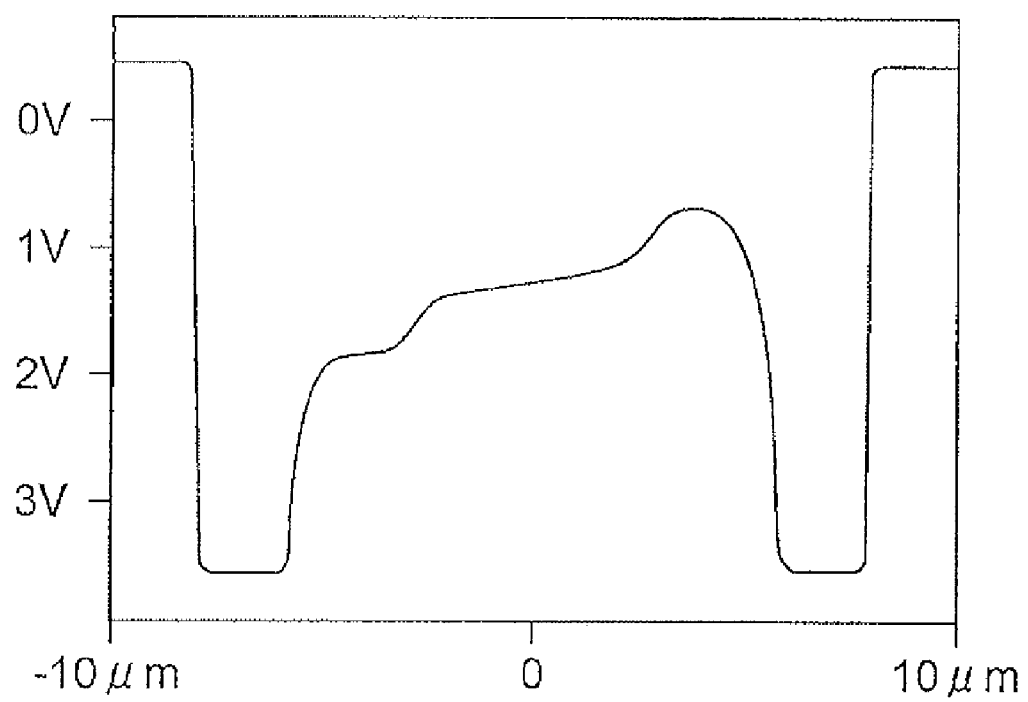
FIG. 24 is a graph showing potentials immediately under the photo gate electrode PG, two gate electrodes TX1, TX2, and semiconductor areas FD1, FD2 according to Embodiment 1.

The potential distribution in the semiconductor substrate according to Embodiment 1 is as shown in FIG. 14. FIG. 24 shows potentials immediately under the photo gate electrode PG, two gate electrodes TX1, TX2, and semiconductor areas FD1, FD2 according to Embodiment 1. The abscissa of FIG. 24 is coincident with the abscissa of FIG. 14.

According to the potential distribution of Embodiment 2, it was found that the spread of the potential is further controlled than in Embodiment 1. The potential distribution corresponds to the distribution of the blocking layer. In the distance measuring sensor according to Embodiment 2, the carriers absorbed by the blocking layer extended in the lateral direction are prevented, and coupling thereof with the blocking layer extended from the first and the second semiconductor areas is prevented from occurring. Therefore, since the carriers directly flown into the first and the second semiconductor areas can be prevented, crosstalk can be reduced.

Embodiment 3

The structure of a distance measuring device according to Embodiment 3 is identical to that described in FIG. 1, but the back-illuminated distance measuring sensor 1 that composes the distance measuring device is different therefrom only in the detail thereof. The distance measuring device is provided with the controlling circuit 2, light source 3, driving circuit 4 and calculating circuit 5, which are described in FIG. 1.

Figure 25:
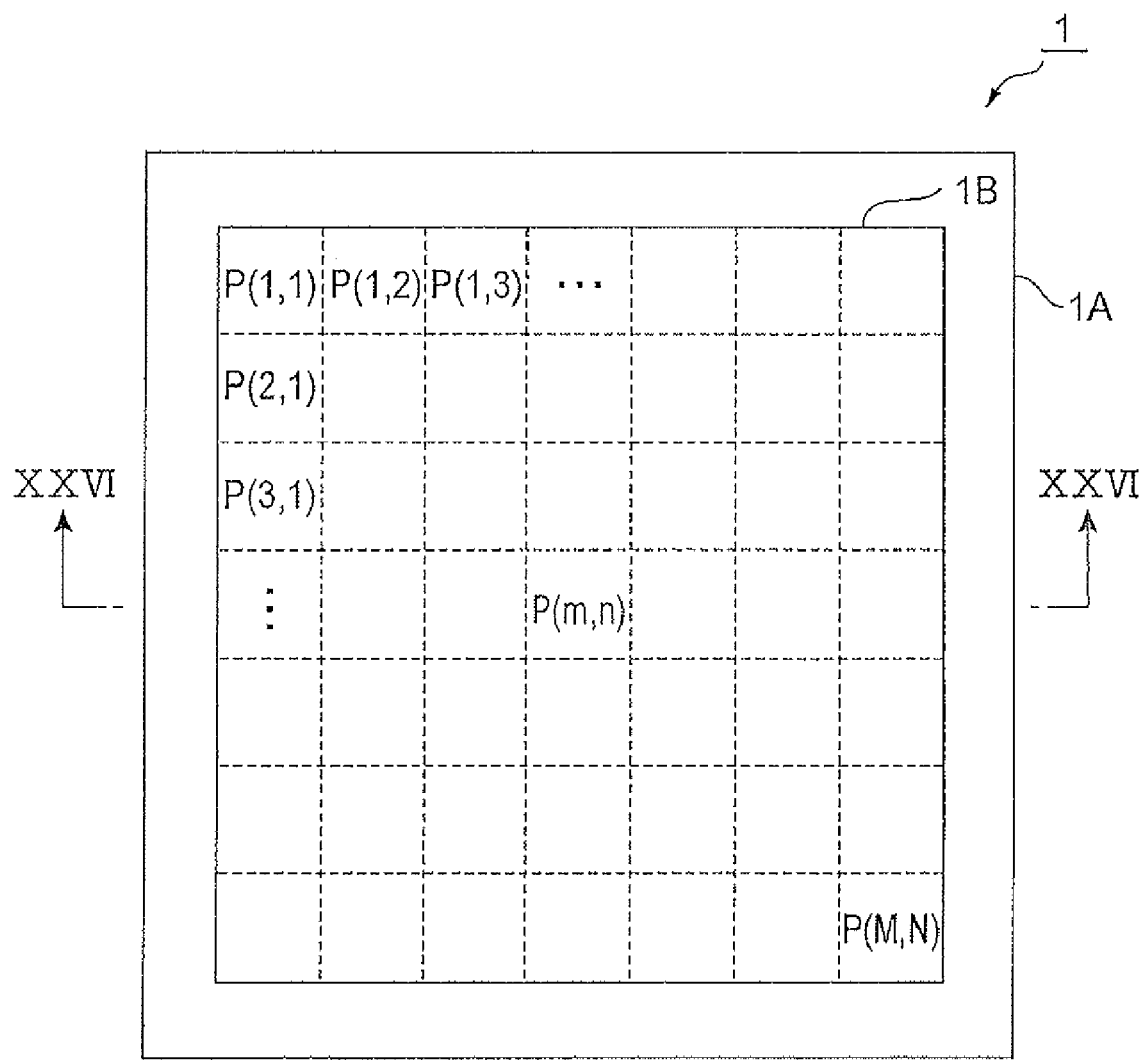
FIG. 25 is a plan view showing a distance measuring sensor according to Embodiment 3.

FIG. 25 is a plan view showing a distance measuring sensor according to Embodiment 3.

The back-illuminated distance measuring sensor 1 is provided with a semiconductor substrate 1A having a pickup area 1B composed of a plurality of two-dimensionally arrayed pixels P (m,n). Two charge quantities (Q1,Q2) are output from respective pixels P (m,n) as signals d' (m,n) having the above-described distance information. Since the respective pixels P (m,n) output signals d'(m,n) responsive to the distance to an object H as micro distance measuring sensors, a distance image of the object can be obtained as an aggregate of distance information to respective points on the object H if reflection light from the object H is imaged on the pickup area 1B.

Figure 26:
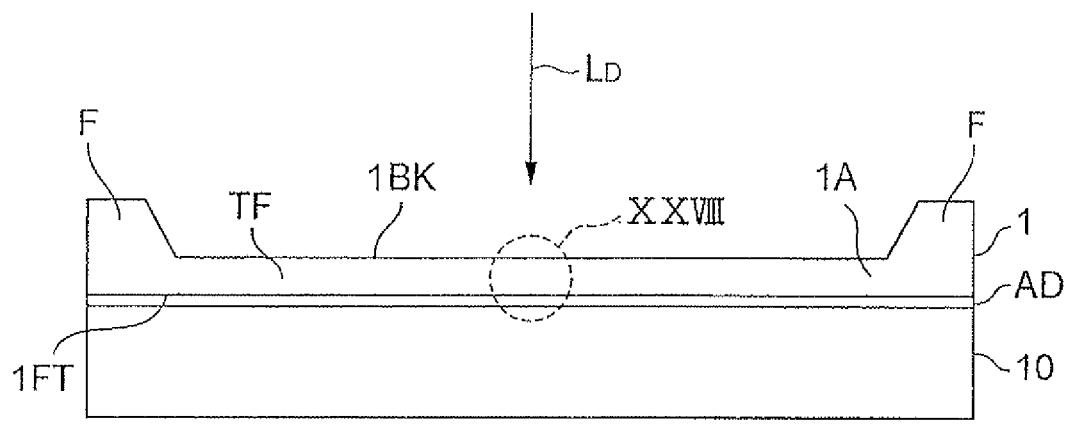
FIG. 26 is a sectional view of a distance measuring sensor shown in FIG. 25, which is taken in the direction of the arrows along the line XXVI-XXVI.

FIG. 26 is a sectional view of a distance measuring sensor shown in FIG. 25, which is taken in the direction of the arrows along the line XXVI-XXVI thereof.

Pulse light $L_D$ is made incident from the light incident surface 1BK into the back-illuminated distance measuring sensor 1. The surface 1FT opposite to the light incident surface 1BK of the back-illuminated distance measuring sensor 1 is connected to a wiring substrate 10 via an adhesive area AD. The adhesive area AD is an area including adhesive elements such as bumps, and has an insulative adhesive agent or filler as necessary. The semiconductor substrate 1A that composes the back-illuminated distance measuring sensor 1 has a reinforcement frame portion F and a thin plate portion TF which is thinner than the frame portion F, which are integrated together. The thickness of the thin plate portion TF is 10 µm or more but 100 µm or less. The thickness of the frame portion F in this example is 200 µm or more but 600 µm or less.

Figure 27:
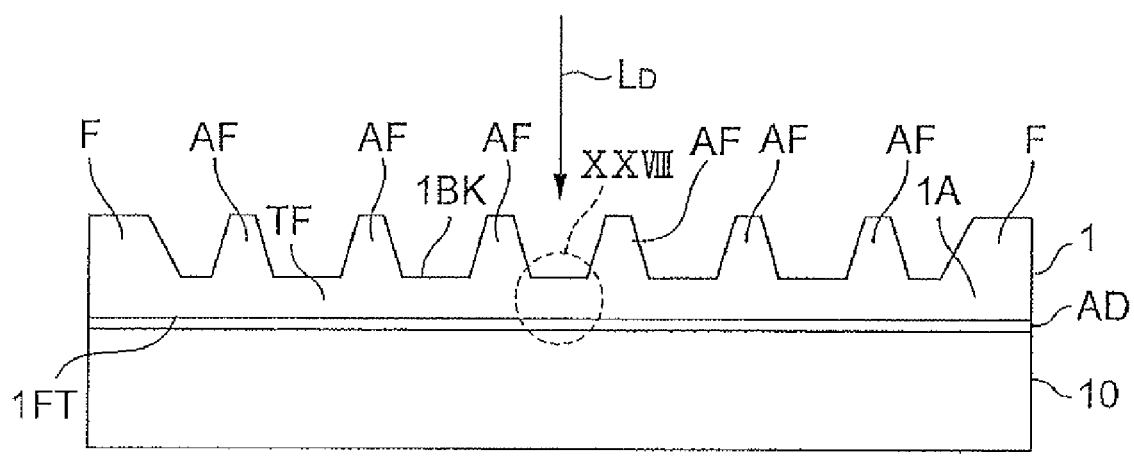
FIG. 27 is a sectional view showing a distance measuring sensor according to a modified version thereof.

FIG. 27 is a sectional view of a distance measuring sensor according to a modified version of Embodiment 3.

The distance measuring sensor is different from the sensor shown in FIG. 26 only in the shape of the semiconductor substrate 1A, and other configurations remain the same. The semiconductor substrate 1A further has reinforcement portions AF formed like stripes or like a lattice, and a thin plate portion TF is formed between the reinforcement portions AF, which are integrated together. The thickness of the reinforcement portion AF according to the present version is the same as the thickness of the frame portion AF, and is 200 µm or more but 600 µm or less. The respective pixels described above are formed at the thin plate portion The thin plate portion TF is formed by wet etching using an alkali etching solution such as KOH. The roughness of the exposed surface formed by etching is 1 µm or less.

Figure 28:
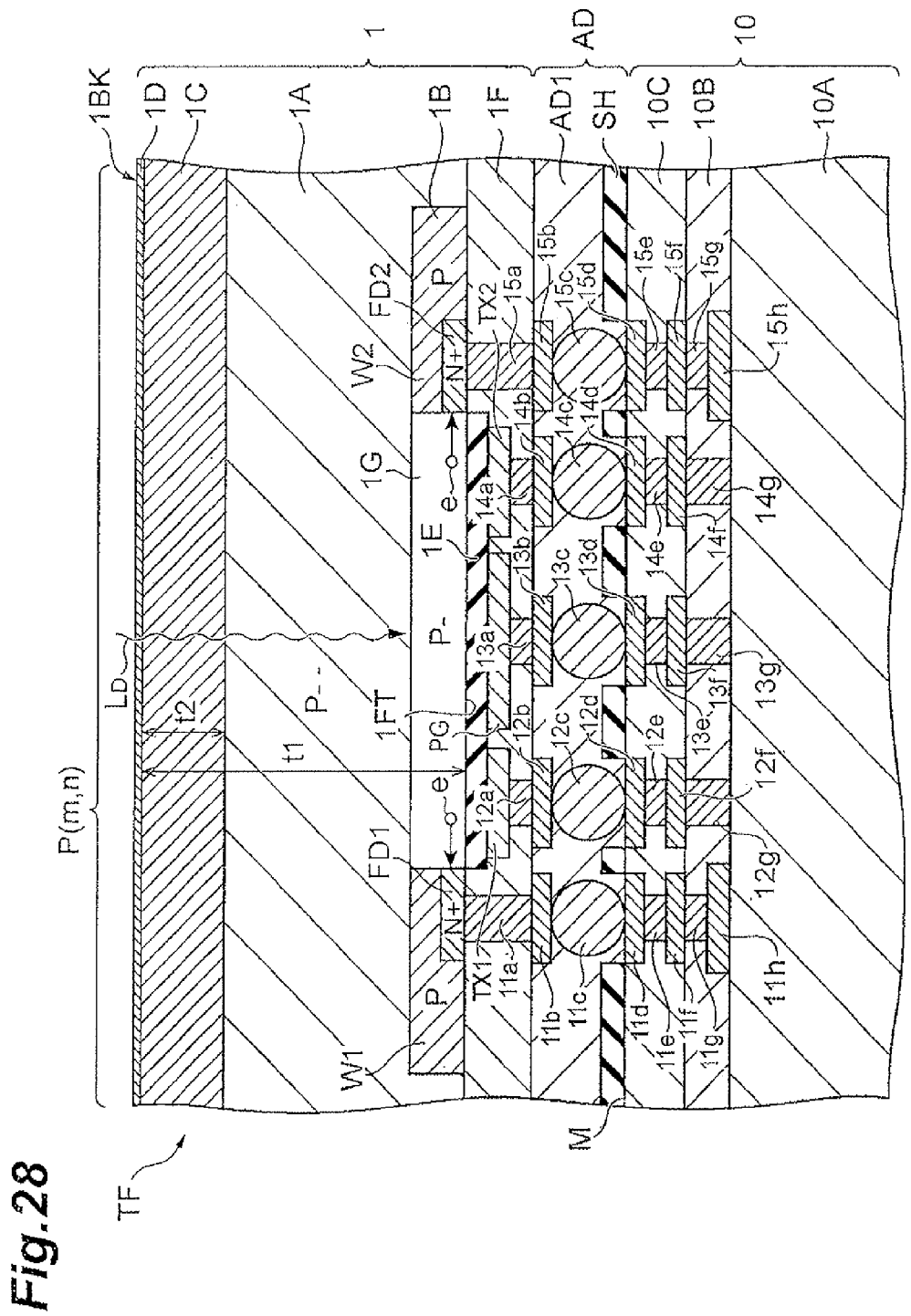
FIG. 28 is an enlarged view of an area XXVIII of the distance measuring sensor shown in FIG. 26 or FIG. 27.

FIG. 28 is an enlarged view of an area XXVIII of the distance measuring sensor shown in FIG. 26 or FIG. 27.

Since the basic structure of the back-illuminated distance measuring sensor 1 is the same as that according to Embodiment 2, which is shown in FIG. 18, a description is given only of differing points.

That is, in the back-illuminated distance measuring sensor 1, parts of the first and the second semiconductor areas FD1 and FD2 are brought into contact with the area immediately under the respective gate electrodes TX1 and TX2 in the semiconductor substrate 1A. A reflection preventing film 1D is provided at the side of the light incident surface 1BK of the semiconductor substrate 1A via a visible light pumping carrier re-coupled area 1C. That is, the visible light pumping carrier re-coupled area 1C consisting of a P-type semiconductor layer or a defect layer is provided at the light incident surface side of the semiconductor substrate 1A. The thickness of the visible light pumping carrier re-coupled area 1C consisting of the P-type semiconductor layer is 0.1 µm through 5 µm, and the impurity density thereof is $10^{18}$ cm$^{-3}$ through $10^{20}$ cm$^{-3}$, wherein carriers generated by incidence of visible light are re-coupled and diminished. In addition, the thickness of the visible light pumping carrier re-coupled area 1C consisting of a defect layer by gettering or ion implantation, etc., is 0.1 µm through 5 µm, wherein the carriers generated by incidence of visible light are re-coupled and diminished.

Where it is assumed that the absorption coefficient of visible light in the semiconductor substrate 1A is $\alpha$, the thickness of the semiconductor substrate 1A (that is, the thickness of the entirety of the thin plate portion including the re-coupled area 1C) is t1, and the thickness of the visible light pumping carrier re-coupled area is t2, it is preferable that the following relational expressions are satisfied.

$$-(1/\alpha) \times \ln(0.5) \mu m \leq t2$$

$$10\ \mu m \leq t1 \leq 100\ \mu m$$

In this case, since, in the visible light pumping carrier re-coupled area 1C, 50% thereof is diminished, and the carriers do not reach the area immediately under the photo gate electrode PG, and further, since the near-infrared light is absorbed in the area the depth of which is 10 µm or more but 100 µm or less, it is possible to collect carriers, which have excellent response in the area immediately under the photo gate electrode PG, at high sensitivity.

In addition, the surface roughness of the exposed surface of the visible light pumping carrier re-coupled area 1C, that is, the difference in height between the maximum value and the minimum value for the surface unevenness is 1 µm or less.

The material of the reflection preventing film 1D is $SiO_2$ or SiN.

The area immediately under the photo gate electrode PG is a P-type that is the same conductive type as that of the semiconductor substrate 1A, and is composed of an electric field concentrated area 1G having a higher impurity density than the impurity density of the semiconductor substrate 1A. The area functions as described in Embodiment 2.

Figure 29:
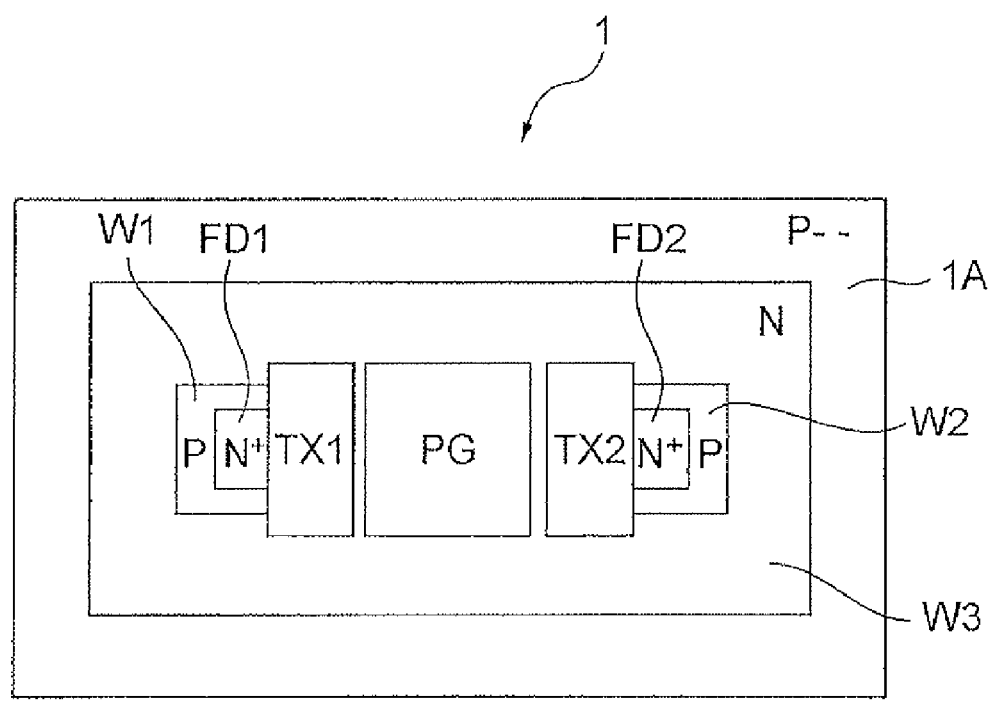
FIG. 29 is a plan view of a pixel of the distance measuring sensor according to Embodiment 3.

FIG. 29 is a plan view of a pixel of the distance measuring sensor according to Embodiment 3.

In the back-illuminated distance measuring sensor 1, an N-type well area W3 may be provided outside the P-type well area W2. The well area W3 can separate pixels and can absorb unnecessary carriers generated in accordance with stray light. In addition, the depths of the well areas W1, W2 and W3 are identical to each other. Further, the thickness/impurity density of the respective semiconductor areas are as follows:

Semiconductor Substrate 1A:
Thickness 10 μm through 100 μm/Impurity density $1 \times 10^{12}$ through $10^{15}$ cm$^{-3}$ Well Areas W1 and W2
Thickness 0.5 μm through 3 μm/Impurity density $1 \times 10^{16}$ through $10^{18}$ cm$^{-3}$ Semiconductor Area FD1 and FD2:
Thickness 0.1 μm through 0.4 μm/impurity density $1 \times 10^{18}$ through $10^{20}$ cm$^{-3}$ Well Area W3:
Thickness 0.5 μm through 3 μm/Impurity density $1 \times 10^{16}$ through $10^{18}$ cm$^{-3}$ Electric Field Concentrated Area 1G (FIG. 28)
Thickness 0.2 μm through 3 μm/impurity density $1 \times 10^{13}$ through $10^{16}$ cm$^{-3}$ In the present example, by using a high resistance substrate (in the present example, the specific resistance is 10 kΩ·cm) as the semiconductor substrate 1A, the blocking layer is radially extended from the area immediately under the photo gate electrode PG when a bias voltage is applied to the photo gate electrode PG, and the utilization efficiency of light (quantum efficiency) is increased, and the charge attempted to directly enter the first and the second semiconductor areas FD1 and FD2 is captured, thereby reducing crosstalk.

Further, in the present example, it is assumed that the thickness of the semiconductor substrate 1A is 20 μm, the impurity density is $1 \times 10^{12}$ cm$^{-3}$, the impurity density of the well areas W1 and W2 is $1 \times 10^{17}$ cm$^{-3}$, the impurity density of the semiconductor areas FD1 and FD2 is $1 \times 10^{19}$ cm$^{-3}$, the impurity density of the well area W3 is $1 \times 10^{17}$ cm$^{-3}$, and the impurity density of the electric field concentrated area 1G is $1 \times 10^{15}$ cm$^{-3}$.

Also, the structure of the vicinity of the back gate is the same as that described in FIG. 7 of Embodiment 1.

Figure 30:
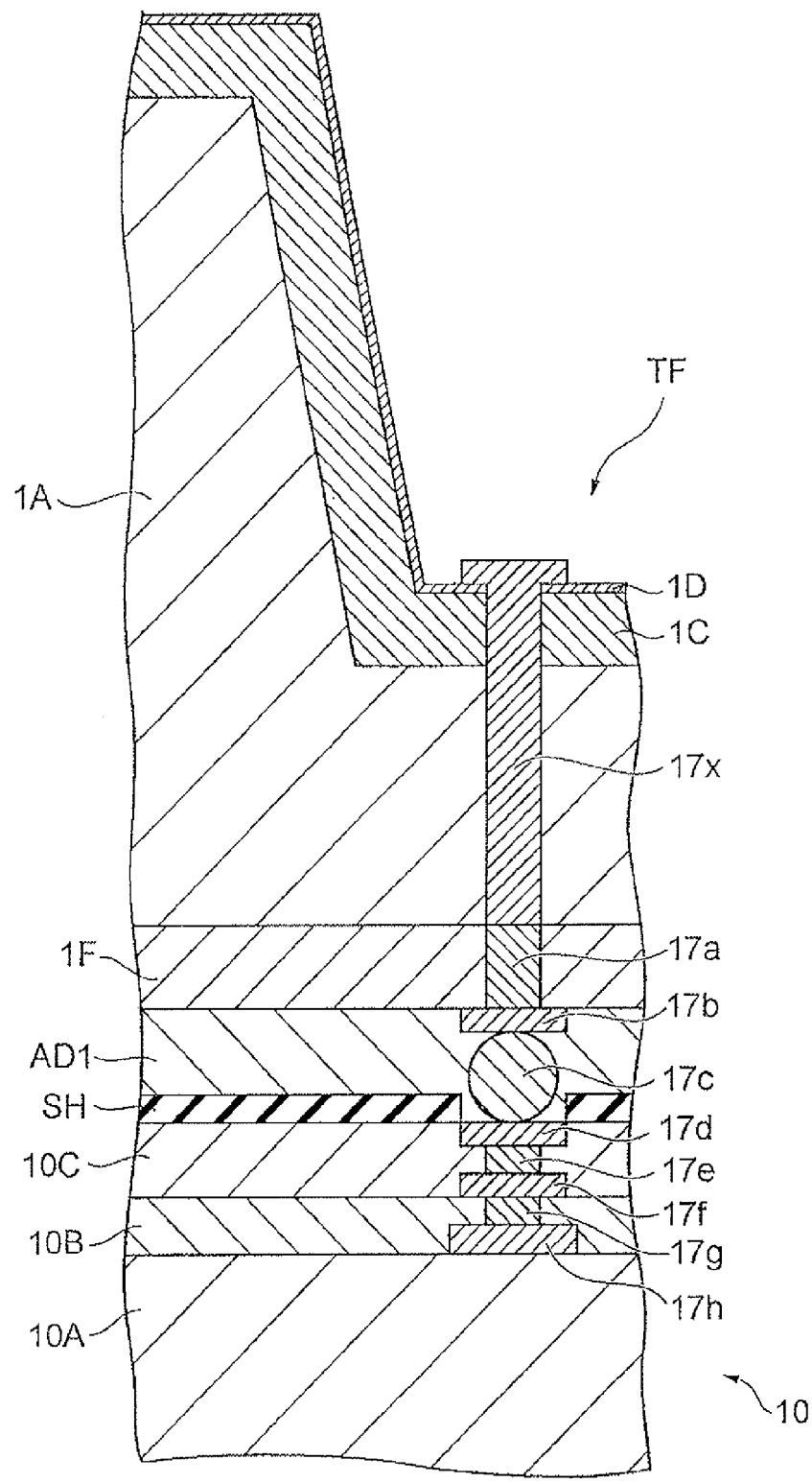
FIG. 30 is a sectional view showing the vicinity of a penetration electrode.

FIG. 30 is a sectional view showing the vicinity of a penetration electrode,

In order that the potential of the semiconductor substrate 1A of the back-illuminated distance measuring sensor 1 described above is fixed at the reference potential, a penetration electrode 17x that is electrically connected to the visible light pumping carrier re-coupled area 1C composed of a P-type semiconductor layer may be provided instead of the back gate electrode. A ground wiring 17h is provided on the semiconductor substrate 10A of the wiring substrate 10. A contact electrode 17a, a pad electrode 17b, a bump 17c, a pad electrode 17d, a contact electrode 17e, an intermediate electrode 17f and a contact electrode 17g intervene between the penetration electrode 17x and the ground wiring 17h, which are electrically connected to each other.

Further, the carrier accumulating action and reading action are the same as those of Embodiment 2. Also, the thickness t1 of the thin plate portion of the semiconductor substrate 1A in the present mode is 10 μm through 100 μm, light in a visible band shorter than that in the near-infrared band is absorbed, wherein highly accurate distance measurement can be achieved without providing a visible light cut filter at the light incident surface side. In other words, the thickness t of the light-sensitive area is $t=t1-((-1/\alpha) \times \ln(I/I_O))$. In addition, since light in a visible band shorter than that in the near-infrared band is absorbed at the light incident surface of a semiconductor substrate of the back-illuminated distance measuring sensor, highly accurate distance measurement can be brought about without providing a visible light cut filter at the light incident surface side. Further, in the present example, necessary signals are of a near-infrared wavelength, and, if the blocking layer immediately under the photo gate electrode is extended to the thickness of the substrate by adjusting the substrate density and the application voltage, etc., a higher sensitivity than the surface incident type distance measuring sensor can be brought about. Still further, if the blocking layer is extended, the crosstalk for oblique incidence can be reduced.

Still further, since light that has once transmitted through the semiconductor substrate is reflected by metal if the gate electrodes PG, TX1 and TX2 are made of metal or polysilicon and have the light incident surface side formed with a metallic film, the utilization efficiency of light can be raised. Using reflection, the carriers generated in the oblique-lined area R3 can be captured, wherein the sensitivity can be improved.

In addition, a visible band cut filter may be deposited on the light incident surface side of the semiconductor substrate. Also, the above-described distance measuring sensor may be made into a module, including the light source.

Also, the relationship between the frequency of the drive signal and the measurement distance range has been taken into consideration. As a result, where the measurement range is a little less than 1 m up to 200 m, it has been found that it is suitable that the operation frequency of the drive signal is 0.375 MHz through 100 MHz.

Also, since the degree of movement of carriers is an inherent value, the degree of movement is not dependent on the operation frequency. Further, the distribution efficiency (transfer speed) of a charge changes by varying parameters such as voltage applied to the gate electrode, substrate density and gate oxidation film thickness, etc. For example, if high voltage is applied to the gate electrode, and the gate oxidation film thickness is made appropriately thick with a substrate of low density (high resistance), an effect of a fringing electric field is added in addition to movements of the carriers by diffusion, wherein the charge can be transferred at a high speed. If the above-described insulative layer 1E is thickened, a fringing electric field can be formed. The preferable thickness of an insulative layer 1E to form the fringing electric field is 50 nm through 100 nm.

Also, the above-described photo gate electrode PG may be single per distance measuring sensor or such a distance measuring sensor may be configured so that a plurality of micro distance measuring sensors including a photo gate electrode may be one-dimensionally or two-dimensionally arrayed as pixels, and a one-dimensional or two-dimensional distance image can be obtained. In addition, it is possible that a light-shielding film having only the upward side of the photo gate electrode made open is provided on the light incident surface side of the back-illuminated distance measuring sensor 1, wherein crosstalk due to oblique incidence into the semiconductor areas FD1 and FD2 can be reduced.

Still further, the potential distribution in a semiconductor substrate of a distance measuring sensor according to Embodiment 3 is basically the same as that according to Embodiment 2.

The invention claimed is:

1. A back-illuminated distance measuring sensor comprising:
   a semiconductor substrate having a light incident surface and a surface opposed to the light incident surface;
   a photo gate electrode provided on the surface;
   a first and a second gate electrodes which are provided adjacent to the photo gate electrode on the surface; and
   a first and a second semiconductor areas for respectively reading carriers flown from an area immediately under the photo gate electrode into areas immediately under the first and the second gate electrodes,
   wherein the light incident surface side of the semiconductor substrate is provided with a visible light pumping carrier re-coupled area composed of a P-type semiconductor layer or a defect layer.

2. The back-illuminated distance measuring sensor according to claim 1, wherein the semiconductor substrate comprises a pickup area composed of a plurality of pixels, and the respective pixels include:
   the photo gate electrode;
   the first and the second gate electrodes; and
   the first and the second semiconductor areas.

3. The back-illuminated distance measuring sensor according to claim 1, wherein the conductive type of the first and the second semiconductor areas is different from the conductive type of the semiconductor substrate, the first and the second semiconductor areas are formed in a well area, and the conductive type of the well area is the same conductive type as that of the semiconductor substrate, and has a higher impurity density than the impurity density of the semiconductor substrate.

4. The back-illuminated distance measuring sensor according to claim 1, wherein, where it is assumed that the absorption coefficient of visible light in a semiconductor substrate is $\alpha$, the thickness of the semiconductor substrate is t1, and the thickness of the visible light pumping carrier re-coupled area is t2, the following relational expressions are satisfied:

$-(1/\alpha) \times \ln(0.5) \mu m \leq t2$, and $10 \mu m \leq t1 \leq 100 \mu m$.

5. A distance measuring device comprising:
   a back-illuminated distance measuring sensor according to any one of claims 1 or 4;
   a light source for emitting near-infrared light;
   a driving circuit for giving a pulse drive signal to the light source;
   a controlling circuit for giving detection gate signals synchronized with the pulse drive signal to the first and the second gate electrodes; and
   a calculating circuit for calculating the distance to an object based on signals read from the first and the second semiconductor areas.

6. A distance measuring device in which the surface of the back-illuminated distance measuring sensor according to any one of claims 1 or 4 is fixed on the mount surface of a wiring substrate, and the photo gate electrode, the first gate electrode and the second gate electrode are connected to wirings on the wiring substrate via bumps.

* * * * *